United States Patent
Lee

(10) Patent No.: US 11,522,027 B2
(45) Date of Patent: Dec. 6, 2022

(54) DISPLAY DEVICE AND METHOD OF FABRICATING THE SAME

(71) Applicant: Samsung Display Co., LTD., Yongin-si (KR)

(72) Inventor: Hyeonbum Lee, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 95 days.

(21) Appl. No.: 16/876,264

(22) Filed: May 18, 2020

(65) Prior Publication Data
US 2021/0020714 A1   Jan. 21, 2021

(30) Foreign Application Priority Data
Jul. 19, 2019  (KR) .......................... 10-2019-0087824

(51) Int. Cl.
*H01L 27/32*  (2006.01)
*G06F 3/041*  (2006.01)
*G06F 3/044*  (2006.01)

(52) U.S. Cl.
CPC ........ *H01L 27/3246* (2013.01); *G06F 3/0412* (2013.01); *H01L 27/322* (2013.01); *H01L 27/3258* (2013.01); *H01L 27/3272* (2013.01); *G06F 3/0443* (2019.05); *G06F 3/0446* (2019.05); *G06F 2203/04112* (2013.01); *H01L 2227/323* (2013.01)

(58) Field of Classification Search
CPC ............... H01L 27/322; H01L 27/1237; H01L 27/3258; H01L 51/5036; H01L 51/5284; H01L 27/3232; H01L 27/3272
See application file for complete search history.

(56) References Cited

U.S. PATENT DOCUMENTS

| | | |
|---|---|---|
| 2017/0025489 A1 | 1/2017 | Choi et al. |
| 2017/0133443 A1 | 5/2017 | Nendai |
| 2017/0141172 A1 | 5/2017 | Cho et al. |
| 2017/0373124 A1 | 12/2017 | Yang et al. |
| 2018/0033848 A1 | 2/2018 | Jung et al. |

(Continued)

FOREIGN PATENT DOCUMENTS

| | | |
|---|---|---|
| KR | 1020100125502 A | 12/2010 |
| KR | 1020170125289 A | 11/2017 |

(Continued)

OTHER PUBLICATIONS

European Search Report for European Patent Application No. 20186231.5 dated Dec. 11, 2020.

*Primary Examiner* — Kevin Quarterman
(74) *Attorney, Agent, or Firm* — Cantor Colburn LLP

(57) ABSTRACT

A display device includes a substrate including a pixel region and a non-pixel region which is adjacent to the pixel region; a pixel definition layer corresponding to the non-pixel region, the pixel definition layer defining a pixel opening corresponding to the pixel region; an emission element in the pixel opening; a transistor in the non-pixel region, the transistor connected to the emission element; and a planarization insulating layer between the pixel definition layer and the transistor. In the non-pixel region, the planarization insulating layer defines a protruding portion which extends through the pixel definition layer to extend further from the substrate than the pixel definition layer.

18 Claims, 22 Drawing Sheets

(56) References Cited

U.S. PATENT DOCUMENTS

| | | | |
|---|---|---|---|
| 2018/0095581 A1* | 4/2018 | Hwang | ................. G06F 3/0445 |
| 2018/0159067 A1 | 6/2018 | Min | |
| 2019/0131563 A1 | 5/2019 | Liu et al. | |
| 2019/0198816 A1* | 6/2019 | Park | ................... G02B 27/0176 |
| 2019/0371865 A1* | 12/2019 | Lee | ..................... H01L 27/3246 |
| 2020/0013839 A1* | 1/2020 | Tanaka | ................ H01L 27/3276 |
| 2021/0020689 A1* | 1/2021 | Okabe | ................... H01L 33/005 |

FOREIGN PATENT DOCUMENTS

| | | |
|---|---|---|
| KR | 1020180000975 A | 1/2018 |
| KR | 1020180011982 A | 2/2018 |
| KR | 1020180014905 A | 2/2018 |
| KR | 1020190006161 A | 1/2019 |

* cited by examiner

DISPLAY DEVICE AND METHOD OF FABRICATING THE SAME

This application claims priority to Korean Patent Application No. 10-2019-0087824, filed on Jul. 19, 2019, and all the benefits accruing therefrom under 35 U.S.C. § 119, the entire contents of which are hereby incorporated by reference.

BACKGROUND

(1) Field

The present disclosure relates to a display device and a method of fabricating the same. In particular, the present disclosure relates to a display device, which can reduce or effectively prevent damage to a pixel definition layer and can be fabricated with a reduced cost.

(2) Description of the Related Art

Electronic products, such as a smart phone, a digital camera, a notebook computer, a navigation system, and a smart television have a display device which is used to display an image to a user. The display device generates an image and provides the image to a user through a screen.

An organic light emitting display device as one of the display devices, displays an image using an emission element which emits light when electrons and holes are recombined. The organic light emitting display device does not require an additional light source, unlike the liquid crystal display device, and has an excellent brightness property and a relatively wide viewing angle property. In addition, the organic light emitting display device has good technical advantages such as a relatively fast response speed and a relatively low power consumption property.

SUMMARY

An embodiment of the invention provides a display device, which reduces or effectively prevents damage to the pixel definition layer during manufacturing of the display device and can be fabricated with a reduced cost.

According to an embodiment of the invention, a display device includes a substrate including a pixel region and a non-pixel region which is adjacent to the pixel region; a pixel definition layer corresponding to the non-pixel region, the pixel definition layer defining a pixel opening corresponding to the pixel region; an emission element in the pixel opening; a transistor in the non-pixel region, the transistor connected to the emission element; and a planarization insulating layer between the pixel definition layer and the transistor. In the non-pixel region, the planarization insulating layer defines a protruding portion which extends through the pixel definition layer to extend further from the substrate than the pixel definition layer.

According to an embodiment, a method of fabricating a display device includes providing a substrate including a pixel region, an emission element in the pixel region, a non-pixel region adjacent to the pixel region, and a transistor in the non-pixel region and connected to the emission element; providing a planarization insulating layer in the non-pixel region, the planarization insulating layer defining a protruding portion in the non-pixel region which extends further from the substrate than a remainder of the planarization insulating layer in the non-pixel region; providing a pixel definition layer in the pixel region and in the non-pixel region, the providing of the pixel defining layer including in the non-pixel region, removing a first removal portion of the pixel definition layer which corresponds to the protruding portion of the planarization insulating layer, and in the pixel region, removing a second removal portion of the pixel definition layer which corresponds to the emission element and is spaced apart from the first removal portion, to define a pixel opening in the pixel region; and providing the emission element in the pixel opening.

According to an embodiment, a display device includes a substrate including a pixel region and a non-pixel region which is adjacent to the pixel region; a transistor in the non-pixel region; a planarization insulating layer covering the transistor, the planarization insulating layer defining in the non-pixel region, a protruding portion extended further from the substrate than a remainder of the planarization insulating layer, where in the non-pixel region, a width of the protruding portion defined by the planarization insulating layer is smaller than a width of the non-pixel region; a pixel definition layer in the non-pixel region, the pixel definition layer defining a pixel opening corresponding to the pixel region; and an emission element in the pixel opening and connected to the transistor.

BRIEF DESCRIPTION OF THE DRAWINGS

Embodiments will be more clearly understood from the following brief description taken in conjunction with the accompanying drawings. The accompanying drawings represent non-limiting, embodiments as described herein.

Figure 1:
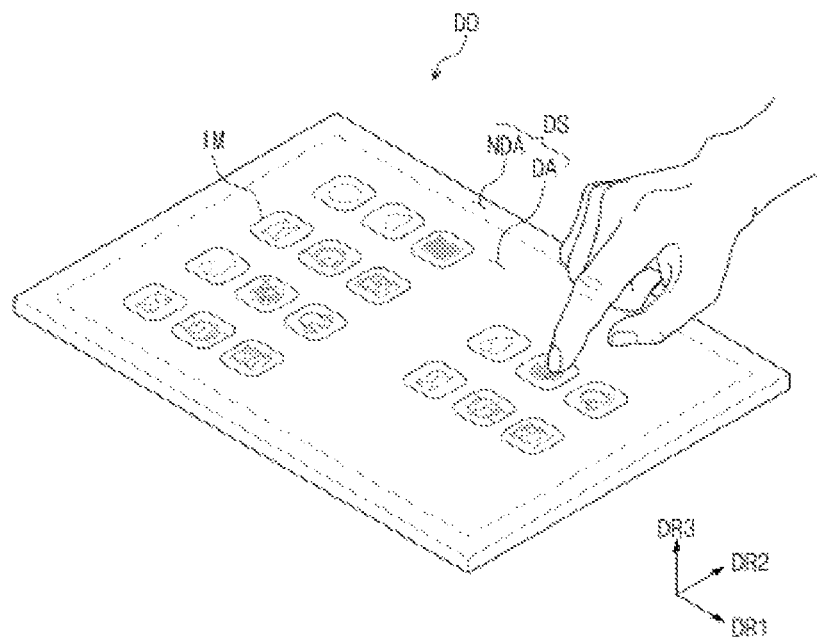
FIG. 1 is a perspective view illustrating an embodiment of a display device.

It should be noted that these figures are intended to illustrate the general characteristics of methods, structure and/or materials utilized in embodiments and to supplement the written description provided below. These drawings are not, however, to scale and may not precisely reflect the precise structural or performance characteristics of any given embodiment, and should not be interpreted as defining or limiting the range of values or properties encompassed by embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Embodiments of the invention will now be described more fully with reference to the accompanying drawings, in which embodiments are shown. Embodiments of the invention may, however, be embodied in many different forms and should not be construed as being limited to the embodiments set forth herein; rather, these embodiments are provided so that this disclosure will be thorough and complete, and will fully convey the concept of embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being related to another element such as being "connected" or "coupled" to another element, it can be directly connected or coupled to the other element or intervening elements may be present. In contrast, when an element is referred to as being related to another element such as being "directly connected" or "directly coupled" to another element, there are no intervening elements present.

As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Embodiments of the invention are described herein with reference to cross-sectional illustrations that are schematic illustrations of idealized embodiments (and intermediate structures) of embodiments. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which embodiments of the invention belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

To fabricate the organic light emitting display device, a pixel definition layer in which pixel openings are defined, is disposed on a substrate, and emission elements are provided in the pixel openings. The emission element includes an organic emission layer, and an organic material for forming the organic emission layer is provided in the pixel openings. A mask in which openings are defined to correspond with the pixel openings, is disposed on the pixel definition layer which defines the pixel openings, and an organic material is provided in the pixel openings of the pixel definition layer through the openings of the mask. The mask is placed to be in contact with a top surface of a portion of the pixel definition layer which directly forms the pixel openings and is supported by such portion of the pixel definition layer. However, since the mask is in contact with the pixel definition layer, the pixel definition layer may be damaged by the mask.

Figure 2:
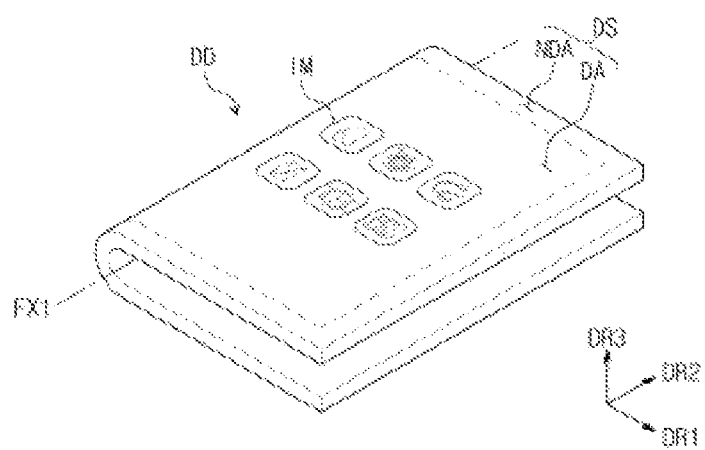
FIGS. 2 and 3 are perspective views illustrating embodiments of the display device of FIG. 1 which is folded.
Figure 3:
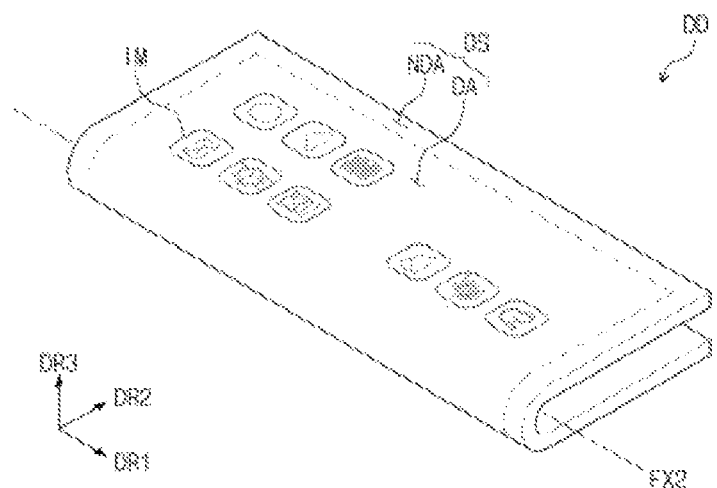

FIG. 1 is a perspective view illustrating an embodiment of a display device DD. FIGS. 2 and 3 are perspective views illustrating embodiments of the display device DD of FIG. 1 which is folded.

Referring to FIG. 1, a display device DD may have a rectangular or tetragonal shape, whose relatively long sides are parallel to a first direction DR1 and whose relatively short sides are parallel to a second direction DR2 crossing the first direction DR1. The display device DD may be disposed in a plane defined by the first direction DR1 and the second direction DR2 which cross each other. However, the invention is not limited to this example, and in an embodiment, the display device DD may have various shapes such as circular and polygonal shapes. The display device DD may be a flexible display device.

Hereinafter, a direction crossing both of the first and second directions DR1 and DR2 will be referred to as a third direction DR3. A thickness of the display device DD and/or various components thereof may be defined along the third direction DR3. Furthermore, in the present specification, the expression "when viewed in a plan view" or "in a plan view" may mean that a relevant structure is viewed along the third direction DR3.

A top surface of the display device DD may be defined as a display surface DS and may be disposed in a plane which is parallel to a plane defined by the first direction DR1 and the second direction DR2. An image IM generated by the display device DD may be provided to a user through the display surface DS. More than one image IM (e.g., images IM) displayed at the display surface DS may be visible from outside the display device DD.

The display surface DS may include or define a display region DA and a non-display region NDA which is adjacent to the display region DA. The image IM may be displayed in the display region DA, where an image IM may not be displayed in the non-display region NDA. In a plan view, the non-display region NDA may be disposed to enclose the display region DA and to define an edge or periphery of the display device DD. In an embodiment, a printed layer or pattern having a specific color may be disposed at the non-display region NDA, such as by printing, without being limited thereto.

The display device DD may be a foldable display device, which can be folded or unfolded relative to the display device DD being disposed in a plane like in FIG. 1. The display device DD may be folded in various directions.

Referring to FIGS. 2 and 3, the display device DD may be bent and folded along a first folding axis FX1 parallel to the second direction DR2. The first folding axis FX1 may be defined as a relatively short axis that is parallel to the relatively short side of the display device DD. In addition, the display device DD may be bent and folded along a second folding axis FX2 parallel to the first direction DR1. The second folding axis FX2 may be defined as a relatively long axis that is parallel to the relatively long side of the display device DD.

The display device DD may be folded in an out-folding manner such that the display surface DS is exposed to the outside. That is, the display device DD which is out-folded (e.g., FIGS. 2 and 3) disposes the display surface DS facing outside the display device DD, while portions of a bottom surface opposite to the display surface DS face each other at an inside of the display device DD. However, the invention is not limited to this example, and in an embodiment, the display device DD may be folded along the first folding axis FX1 or the second folding axis FX2 in an in-folding manner such that portions of the display surface DS face each other at an inside of the display device DD (e.g., are not disposed facing outside the display device DD).

Figure 4:
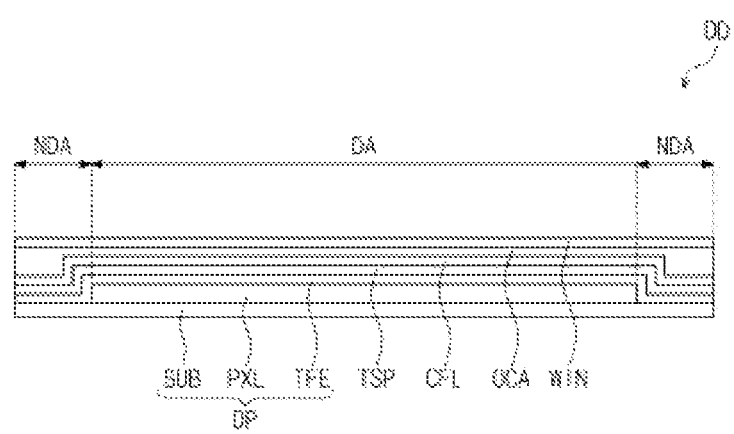
FIG. 4 is a cross-sectional view schematically illustrating an embodiment of a display device.

FIG. 4 is a cross-sectional view schematically illustrating an embodiment of a display device.

Referring to FIG. 4, the display device DD may include a display panel DP, an input-sensing portion TSP (e.g., input-sensing layer TSP) disposed on the display panel DP, a color filter layer CFL disposed on the input-sensing portion TSP, a window WIN disposed on the color filter layer CFL, and a fixing member such as an adhesive element OCA disposed between the color filter layer CFL and the window WIN.

In an embodiment, the display panel DP may be a light-emitting type display panel, but the invention is not limited to a specific type of the display panel DP. In an embodiment, for example, the display panel DP may be an organic light emitting display panel or a quantum dot light emitting display panel. An emission layer of the organic light emitting display panel may be formed of or include an organic luminescent material. An emission layer of the quantum dot light emitting display panel may include a quantum dot, a quantum rod, or the like. For the sake of simplicity, the description that follows will refer to an example in which the display panel DP is the organic light emitting display panel.

The display panel DP may include a substrate SUB, a pixel layer PXL disposed on the substrate SUB, and a thin encapsulation layer TFE disposed on the substrate SUB to cover the pixel layer PXL. The substrate SUB may be a transparent substrate and may include a flexible plastic substrate. In an embodiment, for example, the substrate SUB may include polyimide ("PI").

The substrate SUB may include the display region DA and the non-display region NDA which is adjacent to the display region DA, respectively corresponding to those regions of the display surface DS of the display device DD. The pixel layer PXL may be disposed in the display region DA. The pixel layer PXL may include a plurality of pixels PX, each of which includes an emission element OLED (e.g., light emission element).

The thin encapsulation layer TFE may include at least two inorganic layers and an organic layer which is disposed between the inorganic layers. The inorganic layers may include an inorganic material and may protect the pixel layer PXL from moisture or oxygen. The organic layer may include an organic material and may protect the pixel layer PXL from a contamination material such as dust particles.

The input-sensing portion TSP may sense an external input (e.g., a touch event from outside the display device DD), may generate an input signal from the sensed external input, and may provide the input signal to the display panel DP. The input-sensing portion TSP may include a plurality of sensor portions, which are used to sense the external input. The input-sensing portion TSP may be defined as a touch-sensing portion. A detailed structure of the sensor portions will be described with reference to FIG. 8.

The sensor portions may sense the external input in a capacitive manner. The display panel DP may receive the input signal from the input-sensing portion TSP and may generate an image IM corresponding to the input signal.

The color filter layer CFL may include a plurality of color filters. Each of the color filters may convert a color of light incident thereto to a color of the color filter. A detailed structure of the color filter will be described with reference to FIG. 12.

The window WIN may protect the display panel DP and the input-sensing portion TSP from an external scratch and an external impact. The window WIN may be attached to the input-sensing portion TSP by the adhesive element OCA. The adhesive agent OCA may include an optical clear adhesive. An image produced by the display panel DP may be provided to a user through the window WIN. A top surface of the window WIN may be for the display surface DS of the display device DD, without being limited thereto.

Figure 5:
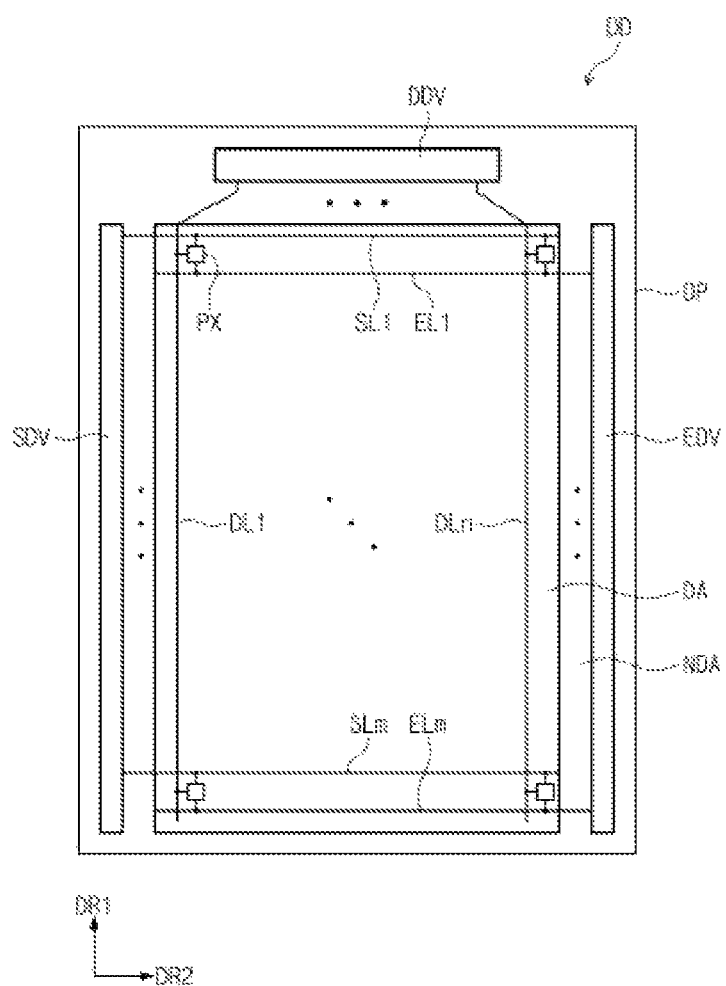
FIG. 5 is a plan view of the display device of FIG. 4.

FIG. 5 is a plan view of the display device of FIG. 4.

A planar structure of the display panel DP is exemplarily illustrated in FIG. 5, but the planar structures of the input-sensing portion TSP, the color filter layer CFL, and the window WIN are omitted.

Referring to FIG. 5, the display device DD may include the display panel DP, a scan driver SDV, a data driver DDV, and an emission driver EDV. Any one of the scan driver SDV, the data driver DDV, and the emission driver EDV may be referred to as a "driver" of the display device DD.

The display panel DP may be a flexible display panel. In an embodiment, for example, the display panel DP may include a plurality of electronic devices disposed on a flexible substrate. The display panel DP may have a rectangular shape whose relatively long sides are parallel to the first direction DR1 and whose relatively short sides are parallel to the second direction DR2, but the invention is not limited to this shape of the display panel DP. The display panel DP may include the display region DA and the non-display region NDA which encloses the display region DA, similar to that described above for the display surface DS of the display device DD, and without being limited thereto.

The display panel DP may include a pixel PX provided in plural (e.g., a plurality of pixels PX), a scan line provided in plural (e.g., a plurality of scan lines SL1-SLm), a data line DL provided in plural (e.g., a plurality of data lines DL1-DLn), and an emission line provided in plural (e.g., a plurality of emission lines EL1-ELm), where m and n are natural numbers. The pixels PX may be disposed in the display region DA and may be connected to the scan lines SL1-SLm, the data lines DL1-DLn, and the emission lines EL1-ELm.

The scan driver SDV, the data driver DDV, and the emission driver EDV may be disposed in the non-display region NDA. The scan driver SDV and the emission driver EDV may be disposed adjacent to the relatively long sides, respectively, of the display panel DP. The data driver DDV may be manufactured in the form of an integrated circuit chip and may be disposed adjacent to one of the relatively short sides of the display panel DP.

The scan lines SL1-SLm may be lengthwise extended along the second direction DR2 and may be connected to the scan driver SDV. The data lines DL1-DLn may be lengthwise extended along the first direction DR1 and may be connected to the data driver DDV. The emission lines EL1-ELm may be lengthwise extended along the second direction DR2 and may be connected to the emission driver EDV.

The scan driver SDV may produce one or more of electrical signals such as a plurality of scan signals, and the scan signals may be applied to the pixels PX through the scan lines SL1-SLm. The scan signals may be sequentially applied to the pixels PX. The data driver DDV may produce one or more of an electrical signal such as a plurality of data voltages, and the data voltages may be applied to the pixels PX through the data lines DL1-DLn. The emission driver EDV may produce one or more of electrical signals such as a plurality of emission signals, and the emission signals may be applied to the pixels PX through the emission lines EL1-ELm. That is, the display region DA may be connected to the non-display region NDA, and is driven and/or controlled by an electrical signal provided from the non-display region NDA.

The display device DD may further include a timing controller (not shown) for controlling operations of the scan driver SDV, the data driver DDV, and the emission driver EDV.

The timing controller may produce scan control signals, data control signals and emission control signals, in response to one or more of electrical signals such as control signals transmitted from outside the timing controller and/or the display panel DP. The timing controller may receive one or more of electrical signals such as image signals from the outside, may convert the image signals to a data format, which is suitable for interface specifications required by the data driver DDV, and may provide the converted data to the data driver DDV.

The scan driver SDV may produce scan signals in response to the scan control signal, and the emission driver EDV may produce emission signals in response to the emission control signal. The data driver DDV may receive the image signals of the converted data format and then may generate data voltages corresponding to the image signals, in response to the data control signal.

The pixels PX may receive the data voltages in response to the scan signals. The pixels PX may emit light, which has a brightness level corresponding to the data voltage and constitutes an image, in response to the emission signals. A light-emitting time of the pixel PX may be controlled by the emission signals.

Figure 6:
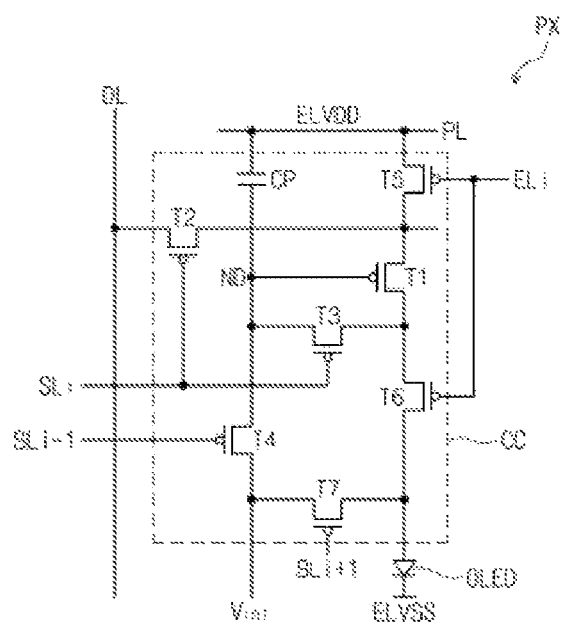
FIG. 6 is an equivalent circuit diagram illustrating an embodiment of a circuit structure of a pixel shown in FIG. 5.

FIG. 6 is an equivalent circuit diagram illustrating an embodiment of a circuit structure of a pixel PX shown in FIG. 5.

Referring to FIG. 6, the pixel PX may include an emission element OLED and a pixel circuit CC. The pixel circuit CC may include a transistor provided in plural (e.g., a plurality of transistors T1-T7) and a capacitor CP. The pixel circuit CC may be connected to the emission element OLED, such as to control an amount of electrical current flowing through the emission element OLED, in response to the data voltage.

The emission element OLED may emit light, whose brightness is determined by an amount of electrical current supplied from the pixel circuit CC. For this, a first voltage ELVDD may be set to a level that is higher than a level of a second voltage ELVSS.

Each of the transistors T1-T7 may include an input or source electrode, an output or drain electrode, and a control or gate electrode. In the present specification, for convenience in description, one of the input and output electrodes may be referred to as "a first electrode" and the other may be referred to as "a second electrode."

The first electrode of the first transistor T1 may be coupled to a power line PL, to which the first voltage ELVDD is applied, through the fifth transistor T5, and the second electrode may be coupled to an anode electrode of the emission element OLED through the sixth transistor T6. The first transistor T1 may be defined as a driving transistor. The first transistor T1 may control an amount of electrical current flowing through the emission element OLED, based on a voltage applied to the control electrode of the first transistor T1.

The second transistor T2 may be disposed between and coupled to a data line DL and the first electrode of the first transistor T1, and the control electrode of the second transistor T2 may be coupled to an i-th scan line SLi. If the second transistor T2 is turned on by an i-th scan signal Si provided through the i-th scan line SLi, the data line DL may be electrically connected to the first electrode of the first transistor T1.

The third transistor T3 may be disposed between and coupled to the second electrode and the control electrode of the first transistor T1. The control electrode of the third transistor T3 may be coupled to the i-th scan line SLi. If the third transistor T3 is turned on by the i-th scan signal Si provided through the i-th scan line SLi, the second electrode and the control electrode of the first transistor T1 may be electrically connected to each other. That is, if the third transistor T3 is turned on, the first transistor T1 may function as a diode.

The fourth transistor T4 may be disposed between and coupled to a node ND and an initialization power generator (not shown). The control electrode of the fourth transistor T4 may be coupled to an (i−1)-th scan line SLi−1. If the fourth transistor T4 is turned on by an (i−1)-th scan signal Si−1 provided through the (i−1)-th scan line SLi−1, an initialization voltage Vint may be provided to the node ND.

The fifth transistor T5 may be disposed between and coupled to the power line PL and the first electrode of the first transistor T1. The control electrode of the fifth transistor T5 may be coupled to an i-th emission line ELi.

The sixth transistor T6 may be disposed between and coupled to the second electrode of the first transistor T1, and the anode of the emission element OLED. The control electrode of the sixth transistor T6 may be coupled to the i-th emission line ELi.

The seventh transistor T7 may be disposed between and coupled to the initialization power generator (not shown) and the anode of the emission element OLED. The control electrode of the seventh transistor T7 may be coupled to an (i+1)-th scan line SLi+1. If the seventh transistor T7 is turned on by an (i+1)-th scan signal Si+1 provided through the (i+1)-th scan line SLi+1, the initialization voltage Vint may be provided to the anode of the emission element OLED.

The capacitor CP may be disposed between the power line PL and the node ND.

The capacitor CP may store a data voltage. When the fifth and sixth transistors T5 and T6 are turned on, an amount of electrical current flowing through the first transistor T1 may be controlled by a voltage stored in the capacitor CP.

FIG. 6 illustrates an example in which PMOS transistors are used as the transistors T1-T7, but the invention is not limited to this example. In an embodiment, for example, the transistors T1-T7 may be NMOS transistors.

Figure 7:
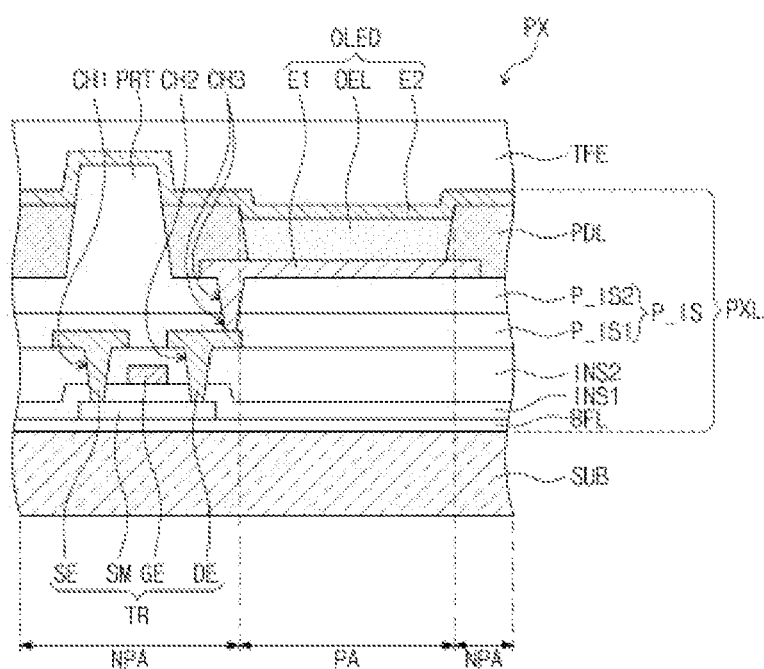
FIG. 7 is an enlarged cross-sectional view illustrating an embodiment of a portion of a display device including an emission element shown in FIG. 6.

FIG. 7 is an enlarged cross-sectional view illustrating an embodiment of a portion of a display device DD, in which an emission element OLED shown in FIG. 6 is disposed. Referring to FIGS. 4 and 7, the portion of the display device DD may be a pixel PX of the display panel DP, without being limited thereto.

Referring to FIG. 7, the pixel PX may include the emission element OLED and a transistor TR which is connected to the emission element OLED. The emission element OLED may include a first electrode E1, a second electrode E2, and an organic emission layer OEL which is disposed between the first electrode E1 and the second electrode E2. The transistor TR may be the sixth transistor T6 shown in FIG. 6. The emission element OLED may be defined as an organic light emitting element or light emitting element.

The first electrode E1 may be an anode, and the second electrode E2 may be a cathode. The first electrode E1 may be defined as a pixel electrode, and the second electrode E2 may be defined as a common electrode.

The pixel PX may be divided into a pixel region PA and a non-pixel region NPA which is adjacent to the pixel region PA. The emission element OLED may be disposed in the pixel region PA, and the transistor TR may be disposed in the non-pixel region NPA. The pixel region PA may be a light emitting region at which light is generated and/or emitted. Light may not be emitted at the non-pixel region NPA, without being limited thereto.

The transistor TR and the emission element OLED may be disposed on the substrate SUB. A buffer layer BFL may be disposed on the substrate SUB, and in an embodiment, the buffer layer BFL may be formed of or include an inorganic material.

A semiconductor layer SM of the transistor TR may be disposed on the buffer layer BFL. The semiconductor layer SM may be formed of or include n inorganic semiconductor material, such as amorphous or polycrystalline silicon, or organic semiconductor materials. In an embodiment, the semiconductor layer SM may be formed of or include an oxide semiconductor material. Although not shown in FIG. 7, the semiconductor layer SM may include a source region, a drain region, and a channel region between the source region and the drain region.

A first insulating layer INS1 may be disposed on the buffer layer BFL to cover the semiconductor layer SM. The first insulating layer INS' may include an inorganic material. A gate electrode GE of the transistor TR may be disposed on the first insulating layer INS1 to be overlapped with the semiconductor layer SM. The gate electrode GE may be disposed to be overlapped with the channel region of the semiconductor layer SM.

A second insulating layer INS2 may be disposed on the first insulating layer INS1 to cover the gate electrode GE. The second insulating layer INS2 may include an organic material and/or an inorganic material.

A source electrode SE and a drain electrode DE of the transistor TR may be disposed on the second insulating layer INS2 to be spaced apart from each other. The source electrode SE may be connected to a source region of the semiconductor layer SM through or at a first contact hole CH1, which is defined in the first insulating layer INS1 and the second insulating layer INS2. The drain electrode DE may be connected to a drain region of the semiconductor layer SM through or at a second contact hole CH2, which is defined in the first insulating layer INS1 and the second insulating layer INS2.

A planarization insulating layer P_IS may be disposed on the second insulating layer INS2 to cover the source electrode SE and the drain electrode DE of the transistor TR. The planarization insulating layer P_IS may provide a flat top surface. The planarization insulating layer P_IS may include a first planarization insulating layer P_IS1, which is disposed on the second insulating layer INS2 to cover the source electrode SE and the drain electrode DE of the transistor TR, and a second planarization insulating layer P_IS2, which is disposed on the first planarization insulating layer P_IS1.

Each of the first and second planarization insulating layers P_IS1 and P_IS2 may be formed of or include an organic material. The first and second planarization insulating layers P_IS1 and P_IS2 may be formed of or include the same organic material. However, the invention is not limited to this example, and in an embodiment, the first and second planarization insulating layers P_IS1 and P_IS2 may be formed of or include different organic materials from each other. The second planarization insulating layer P_IS2 may include photo-sensitive polyimide ("PSPI").

The first electrode E1 may be disposed on the planarization insulating layer P_IS. The first electrode E1 may be connected to the drain electrode DE of the transistor TR through or at a third contact hole CH3, which is defined in the planarization insulating layer P_IS. The third contact hole CH3 may be defined in the first and second planarization insulating layers P_IS1 and P_IS2.

A pixel definition layer PDL (e.g., pixel definition pattern PDL) may be disposed on the first electrode E1 and the planarization insulating layer P_IS to expose a portion of the first electrode E1 to outside the pixel definition layer PDL. The pixel definition layer PDL may be overlapped with or correspond to the non-pixel region NPA. A pixel opening PX_OP (refer to FIG. 12) may be defined in and by the pixel definition layer PDL to expose the portion of the first electrode E1 to outside the pixel definition layer PDL in a region overlapped with or corresponding to the pixel region PA.

A protruding portion PRT of the second planarization insulating layer P_IS2 may be disposed in the non-pixel region NPA. That is, the second planarization insulating layer P_IS2 in the pixel region PA may extend to the non-pixel region NPA and define the protruding portion PRT. The protruding portion PRT may be provided to extend through a thickness of the pixel definition layer PDL and may be extended to a level higher than the pixel definition layer PDL. The structure of the protruding portion PRT will be described in more detail with reference to FIG. 12.

The organic emission layer OEL may be disposed in the pixel opening PX_OP and on the first electrode E1. The organic emission layer OEL may generate one of red, green, and blue lights. However, the invention is not limited to this example, and the organic emission layer OEL may generate a white light through combination of organic materials by which red, green, and blue lights are generated.

The second electrode E2 may be disposed in each of the pixel region PA and the non-pixel region NPA, such as being on and common to each of the pixel definition layer PDL, the organic emission layer OEL, and the protruding portion PRT.

The thin encapsulation layer TFE may be disposed on the pixel definition layer PDL, the emission element OLED, and the protruding portion PRT. The thin encapsulation layer TFE may be disposed on the second electrode E2. A layer as a collection of individual layers described above between the substrate SUB and the thin encapsulation layer TFE may be defined as the pixel layer PXL (refer to FIG. 4).

The first voltage ELVDD may be applied to the first electrode E1, and the second voltage ELVSS may be applied to the second electrode E2. In the case where holes and electrons are injected into the organic emission layer OEL, the holes and electrons may be recombined to produce excitons, and light may be emitted by the emission element OLED, when the excitons transition to a ground state. The emission element OLED may emit red, green or blue light, which constitutes a part of an image IM provided to outside the display panel DP and/or the display device DD, using an electrical current flowing therethrough.

Figure 8:
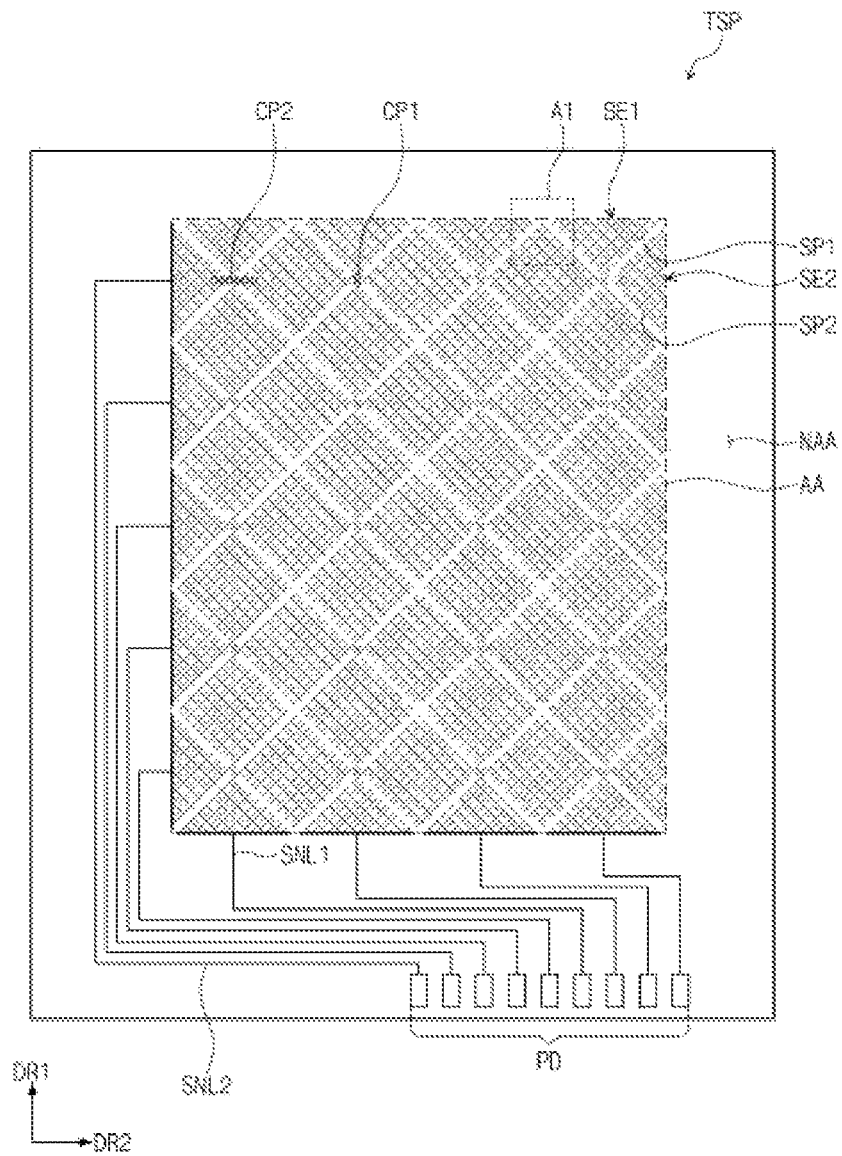
FIG. 8 is a plan view of an embodiment of an input-sensing portion shown in FIG. 4.

FIG. 8 is a plan view of an embodiment of an input-sensing portion TSP shown in FIG. 4.

Referring to FIG. 8, the input-sensing portion TSP may include a sensing electrode provided in plural (e.g., a plurality of sensing electrodes SE1 and SE2), a sensing line provided in plural (e.g., a plurality of lines SNL1 and SNL2), and a pad provided in plural (e.g., a plurality of pads PD). The sensing electrodes SE1 and SE2, the lines SNL1 and SNL2, and the pads PD may be disposed on the thin encapsulation layer TFE.

When viewed in a plan view, the input-sensing portion TSP may include an active region AA and a non-active region NAA which is adjacent to the active region AA. The sensing electrodes SE1 and SE2 may be disposed in the active region AA, and the pads PD may be disposed in the non-active region NAA. The lines SNL1 and SNL2 may be connected to the sensing electrodes SE1 and SE2 and may be extended to the non-active region NAA to be connected to the pads PD.

Although not shown, the pads PD may be connected to a driver, which is used to drive the input-sensing portion TSP, such as through a flexible printed circuit board (not shown).

The sensing electrodes SE1 and SE2 may include a first sensing electrode SE1 provided in plural (e.g., a plurality of first sensing electrodes SE1), which are lengthwise extended along the first direction DR1 and are arranged along the second direction DR2, and a second sensing electrode SE2 provided in plural (e.g., a plurality of second sensing electrodes SE2), which are lengthwise extended along the second direction DR2 and are arranged along the first direction DR1. The lines SNL1 and SNL2 may include a first signal line SNL1 provided in plural (e.g., a plurality of first signal lines SNL1) connected to the first sensing electrodes SE1 and a second signal line SNL2 provided in plural (e.g., a plurality of second signal lines SNL2) connected to the second sensing electrodes SE2.

The second sensing electrodes SE2 may be lengthwise extended to cross a length of the first sensing electrodes SE1 and may be electrically disconnected from the first sensing electrodes SE1. The first sensing electrodes SE1 may be defined as output sensing electrodes, and the second sensing electrodes SE2 may be defined as input sensing electrodes.

Each of the first sensing electrodes SE1 may include a first sensor portion SP1 provided in plural (e.g., a plurality of first sensor portions SP1) which are arranged along the first direction DR1 within a single one of a first sensing electrode SE1, and a first connecting portion CP1 provided in plural (e.g., a plurality of first connecting portions CP1) which connect the first sensor portions SP1 to each other. Each one of the first connecting portions CP1 may be disposed between a corresponding adjacent pair of the first sensor portions SP1 to electrically connect the corresponding adjacent pair of the first sensor portions SP1 to each other.

Each of the second sensing electrodes SE2 may include a second sensor portion SP2 provided in plural (e.g., a plurality of second sensor portions SP2), which are arranged along the second direction DR2 within a single of a second sensing electrode SE2, and a second connecting portion CP2 provided in plural (e.g., a plurality of second connecting portions CP2) which connect the second sensor portions SP2 to each other. Each one of the second connecting portions CP2 may be disposed between a corresponding adjacent pair of the second sensor portions SP2 to electrically connect the corresponding adjacent pair of the second sensor portions SP2 to each other.

The first sensor portions SP1 and the second sensor portions SP2 may have a mesh shape, defined by intersecting solid portions and the sensor openings defined respectively therebetween. The first sensor portions SP1 and the second sensor portions SP2 may be spaced apart from each other, may not be overlapped with each other, and may be disposed in an alternate manner in the plan view. The second connecting portions CP2 may be electrically disconnected from the first connecting portions CP1 and may be disposed to cross the first connecting portions CP1 in the plan view.

The first and second sensor portions SP1 and SP2 and the second connecting portions CP2 may be disposed in a same layer among layers provided on the thin encapsulation layer TFE. The first connecting portions CP1 may be disposed in a layer, which is different from a layer of the first and second sensor portions SP1 and SP2 and the second connecting portions CP2. As being "in a same layer," elements may be respective portions or patterns of a same material layer. In an embodiment, elements in "a same layer" may be provided from a same material layer in manufacturing of the display device DD and/or be disposed at a same distance from a common element, without being limited thereto.

The first signal lines SNL1 may be connected to respective ends (e.g., terminal end or distal end) of the first sensing electrodes SE1 and may be extended to the non-active region NAA to be connected to the pads PD. The second signal lines SNL2 may be connected to respective ends of the second sensing electrodes SE2 and may be extended to the non-active region NAA to be connected to the pads PD.

Figure 9:
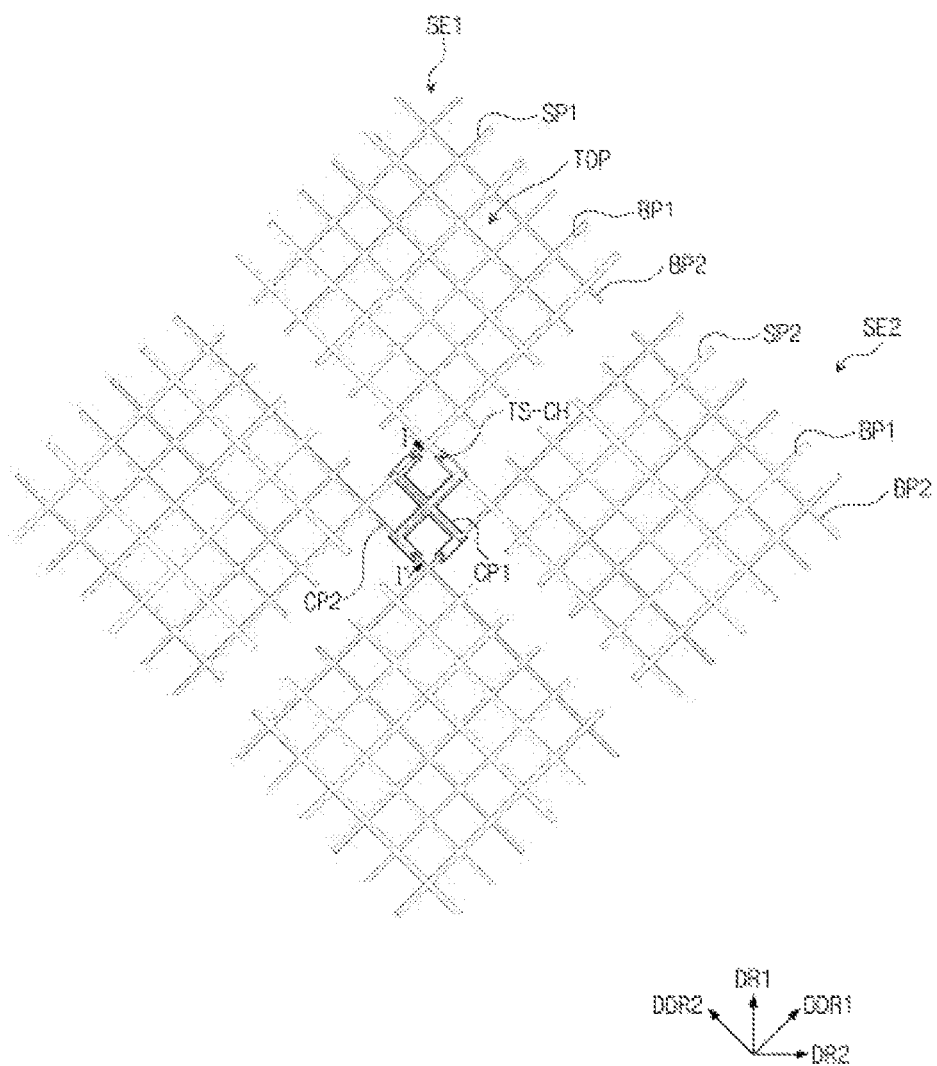
FIG. 9 is an enlarged plan view illustrating an embodiment of a planar structure of first and second sensor portions shown in FIG. 8.
Figure 10:
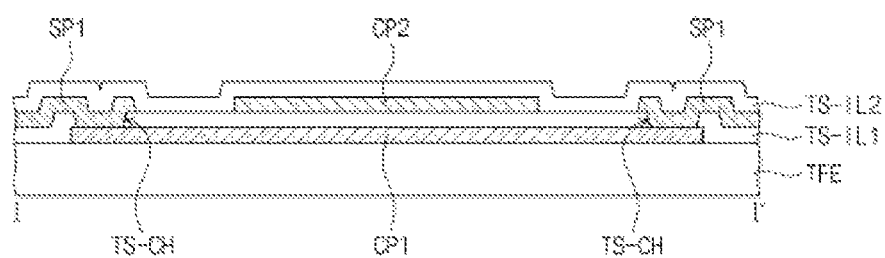
FIG. 10 is an enlarged cross-sectional view taken along line I-I' of FIG. 9.

FIG. 9 is an enlarged plan view illustrating an exemplary embodiment of a planar structure of the first sensor portions SP1 and the second sensor portions SP2 shown in FIG. 8. FIG. 10 is an enlarged cross-sectional view taken along line of FIG. 9.

As an example, FIG. 9 illustrates a pair of the first sensor portions SP1 which are adjacent to each other, and a pair of the second sensor portions SP2 which are adjacent to each other.

Referring to FIG. 9, the first and second sensor portions SP1 and SP2 may each have a mesh shape. In an embodiment, for example, each of the first and second sensor portions SP1 and SP2 may include a first solid portion as a first branch portion BP1 provided in plural (e.g., a plurality of first branch portions BP1) which are extended along a first diagonal direction DDR1, and a second solid portion as a second branch portion BP2 provided in plural (e.g., a plurality of second branch portions BP2) which are lengthwise extended along a second diagonal direction DDR2.

The first diagonal direction DDR1 may be defined as a direction which crosses or is included with respect to the first and second directions DR1 and DR2 in a plane parallel to a plane defined by the first and second directions DR1 and DR2. The second diagonal direction DDR2 may be a direction which crosses or is inclined with respect to the first diagonal direction DDR1 in the plane parallel to the plane defined by the first and second directions DR1 and DR2. In an embodiment, for example, the first direction DR1 and the second direction DR2 may be perpendicular to each other, and the first diagonal direction DDR1 and the second diagonal direction DDR2 may be perpendicular to each other.

The first branch portions BP1 of each of the first and second sensor portions SP1 and SP2 may be provided to respectively cross the second branch portions BP2 and may be connected to the second branch portions BP2, thereby forming a single object such as a discrete pattern where portions are continuously extended to define the single object. Diamond-shaped openings TOP may be defined by the first and second branch portions BP1 and BP2 as solid portions which cross each other. The solid portions of the first and second branch portions BP1 and BP2 may be defined as mesh lines. The mesh lines may define a length and a line width which is taken in a direction normal to the length. A line width of each of the mesh lines may be several micrometers.

The second sensor portions SP2 may be connected to each other by the second connecting portion CP2. In an embodiment, the second sensor portions SP2 and the second connecting portion CP2 may be connected to each other to form a single object. The second connecting portion CP2 may have a mesh shape and may be extended from the second sensor portions SP2.

The first sensor portions SP1 may be electrically connected to each other through the first connecting portion CP1 which is in a different layer from the first sensor portions SP1. The first connecting portion CP1 and the first sensor portions SP1 may not form a single object. The first connecting portion CP1 may be connected to the first sensor portions SP1 through or at a contact hole TS-CH provided in plural (e.g., a plurality of contact holes TS-CH).

Referring to FIG. 10, the first connecting portion CP1 may be disposed on the thin encapsulation layer TFE. A first insulating layer TS-IL1 may be provided on the thin encapsulation layer TFE to cover the first connecting portion CP1. The second connecting portion CP2 and the first sensor portions SP1 may be disposed on the first insulating layer TS-IL1. The second sensor portions SP2 which form a single object with the second connecting portion CP2, may also be disposed on the first insulating layer TS-IL1. A second insulating layer TS-IL2 may be disposed on the first insulating layer TS-IL1 to cover the second connecting portion CP2 and the first sensor portions SP1.

The first connecting portion CP1 may be connected to the first sensor portions SP1 through a plurality of the contact holes TS-CH which are defined in the first insulating layer TS-IL1. Opposite portions or opposing ends of the first connecting portion CP1 may be respectively connected to the first sensor portions SP1 through the contact holes TS-CH.

Figure 11:
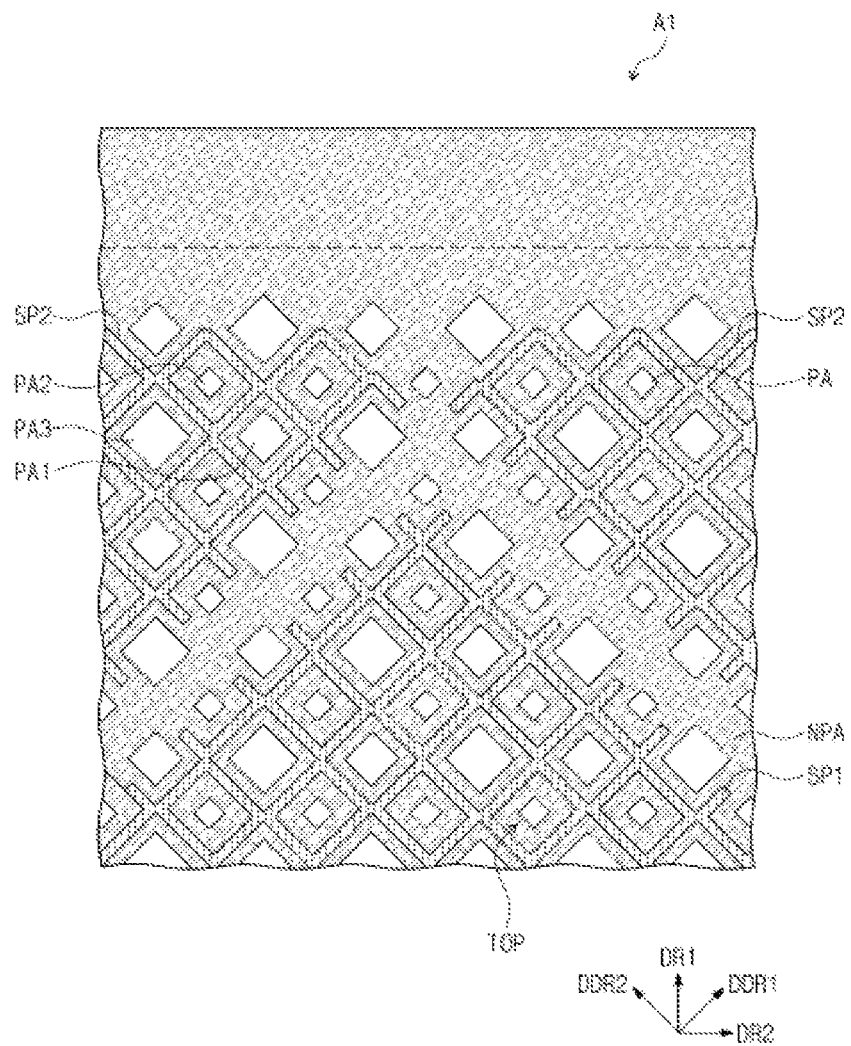
FIG. 11 is an enlarged plan view of a first region A1 of FIG. 8.

FIG. 11 is an enlarged plan view of a first region A1 of FIG. 8.

FIG. 11 is provided to describe a planar shape of the pixel PX relative to features of the input-sensing portion TSP. For convenience in description, a planar shape of the pixels PX, along with the first and second sensor portions SP1 and SP2, are illustrated in FIG. 11.

Referring to FIG. 11, the pixels PX of FIG. 5 may include the pixel region PA provided in plural (e.g., a plurality of pixel regions PA) and the non-pixel region NPA around the pixel regions PA shown in FIG. 11. The pixel region PA of FIG. 7 may be one of the pixel regions PA shown in FIG. 11.

The pixel regions PA may include a first pixel region PA1, a second pixel region PA2 and a third pixel region PA3. The first pixel region PA1 may display a red color, the second pixel region PA2 may display a green color, and the third pixel region PA3 may display a blue color. However, the invention is not limited to this example, and in an embodiment, the pixel regions PA may further include pixels, which are configured to display a magenta, cyan and/or white color.

A planar size or dimensions of each of the pixel regions PA may vary depending on a color of the light emitted from the pixel PX. In an embodiment, for example, the first pixel region PA1 displaying red color light may be larger than the second pixel region PA2 displaying green color light, and the third pixel region PA3 displaying blue color light may be larger than the first pixel region PA1 displaying red color light.

The pixel regions PA may have a diamond shape in the plan view, but the invention is not limited to this example. That is, the pixel regions PA may have various planar shapes (e.g., circular and polygonal shapes). The pixel regions PA may be arranged along the first diagonal direction DDR1 and/or the second diagonal direction DDR2.

The first and second sensor portions SP1 and SP2 may be overlapped with the non-pixel region NPA. Each of the openings TOP may have a shape (e.g., diamond shape), which corresponds to a shape of the pixel region PA and may have a size or dimensions corresponding to a size of the pixel region PA.

The pixel regions PA may be defined as emission regions (e.g., light emission regions), and the non-pixel region NPA may be defined as a non-emission region. Since the first and second sensor portions SP1 and SP2 are disposed in the non-pixel region NPA, light generated in the pixel regions PA may be emitted to outside the input-sensing portion TSP, without influence of the first and second sensor portions SP1 and SP2.

Figure 12:
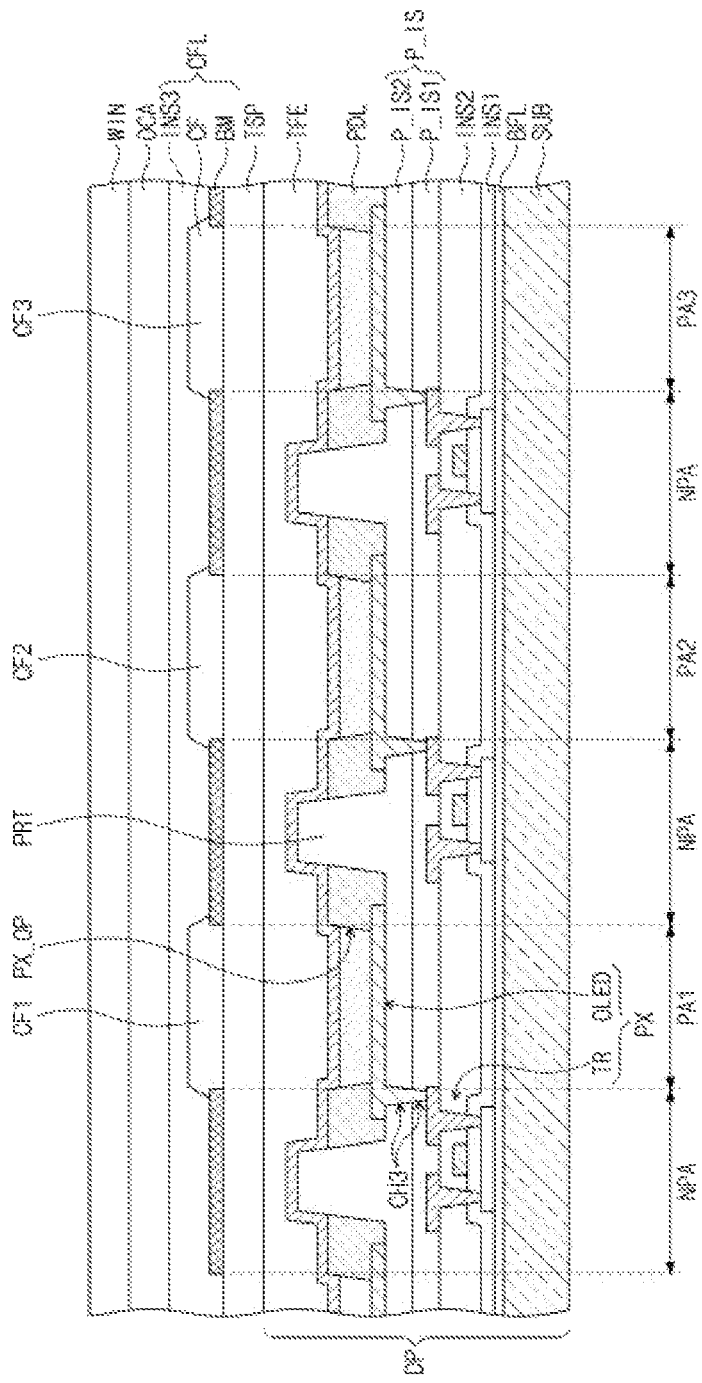
FIG. 12 is an enlarged cross-sectional view illustrating an embodiment of a portion of a display device including first, second, and third pixel regions of FIG. 11.

FIG. 12 is an enlarged cross-sectional view illustrating an embodiment of a portion of a display device DD in which the first pixel region PA1, the second pixel region PA2 and the third pixel region PA3 of FIG. 11 are disposed.

For convenience in illustration, in FIG. 12, the first, second, and third pixel regions PA1, PA2, and PA3 are illustrated to have the same size, and the input-sensing portion TSP is illustrated to be a single layer. In addition, the color filter layer CFL and the window WIN are illustrated along with the display panel DP. Since the structures of the transistor TR and the emission element OLED are described above, a description thereof will be omitted or reduced.

Referring to FIG. 12, the substrate SUB may include the first, second, and third pixel regions PA1, PA2, and PA3 and the non-pixel region NPA which is provided adjacent to each of the first, second, and third pixel regions PA1, PA2, and PA3. The pixel region PA shown in FIG. 7 may be one of the first, second, and third pixel regions PA1, PA2, and PA3.

The transistor TR provided in plural (e.g., transistors TR) may be disposed in the non-pixel region NPA of the substrate SUB, and the emission element OLED provided in plural (e.g., emission elements OLED) may be respectively disposed in a pixel opening PX_OP among a plurality of the pixel openings PX_OP. The emission elements OLED may be connected to the transistors TR through the third contact holes CH3.

The pixel definition layer PDL may block light (e.g., light blocking member) such as by having a black color. Since the pixel definition layer PDL is black, the pixel definition layer PDL may block an unnecessary light in the non-pixel region NPA and may reduce or effectively prevent lights respectively generated by the emission elements OLED from being mixed with each other.

The planarization insulating layer P_IS may be disposed on the substrate SUB to cover the transistors TR. The protruding portion PRT planarization insulating layer P_IS may be overlapped with the non-pixel region NPA and may protrude upward toward the thin film encapsulation layer TFE. In an embodiment, for example, the protruding portion PRT may penetrate the pixel definition layer PDL and may be extended to a level higher than the pixel definition layer PDL. That is, a top surface of the protruding portion PRT which is furthest from the substrate SUB may be positioned at level higher than a top surface of the pixel definition layer PDL which is furthest from the substrate SUB.

The planarization insulating layer P_IS may include the first planarization insulating layer P_IS, which is disposed on the substrate SUB to cover the transistors TR, and the second planarization insulating layer P_IS2, which is disposed on the first planarization insulating layer P_IS1. The second planarization insulating layer P_IS2 may define the protruding portion PRT to penetrate the pixel definition layer PDL and be extended to a level higher than the pixel definition layer PDL.

In a direction along the substrate SUB (e.g., horizontal in FIG. 12), the protruding portion PRT may have a width that is smaller than the non-pixel region NPA defined between the first, second, and third pixel regions PA1, PA2, and PA3. In addition, the protruding portion PRT may have a width that is smaller than a total width of the pixel definition layer PDL at a single portion of the non-pixel region NPA between two adjacent pixel regions.

The input-sensing portion TSP may be disposed on the thin encapsulation layer TFE, the color filter layer CFL may be disposed on the input-sensing portion TSP, and the window WIN may be disposed on the color filter layer CFL. The color filter layer CFL may include a color filter CF provided in plural including a plurality of color filters CF1, CF2, and CF3 which respectively correspond to the pixel regions PA1, PA2, and PA3, and a black matrix BM which corresponds with the non-pixel region NPA.

The color filters CF1, CF2, and CF3 may have colors, which correspond to the first, second, and third pixel regions PA1, PA2, and PA3, respectively. The black matrix BM may be black, and thus, the black matrix BM may block light in the non-pixel region NPA (e.g., light blocking member).

The color filters CF1, CF2, and CF3 may include a first color filter CF1 which is overlapped with and corresponds to the first pixel region PA1 and has a red color, a second color filter CF2 which is overlapped with and corresponds to the second pixel region PA2 and has a green color, and a third color filter CF3 which is overlapped with and corresponds to the third pixel region PA3 and has a blue color.

The first, second, and third color filters CF1, CF2, and CF3 may convert an external light incident to the color filter layer CFL to red, green, and blue lights, respectively. In an embodiment, for example, an external light which is provided toward the display device DD from outside of the display device DD, may be converted to red, green, and blue lights, respectively, by the first, second, and third color filters CF1, CF2, and CF3. Thus, even when the external light is provided to the display device DD, red, green, and blue colors may be displayed at the first, second, and third color filters CF1, CF2, and CF3 corresponding to the first, second, and third pixel regions PA1, PA2, and PA3.

A third insulating layer INS3 may be disposed on the color filters CF1, CF2, and CF3 and the black matrix BM, and the adhesive element OCA may be disposed on the third insulating layer INS3.

Figure 13:
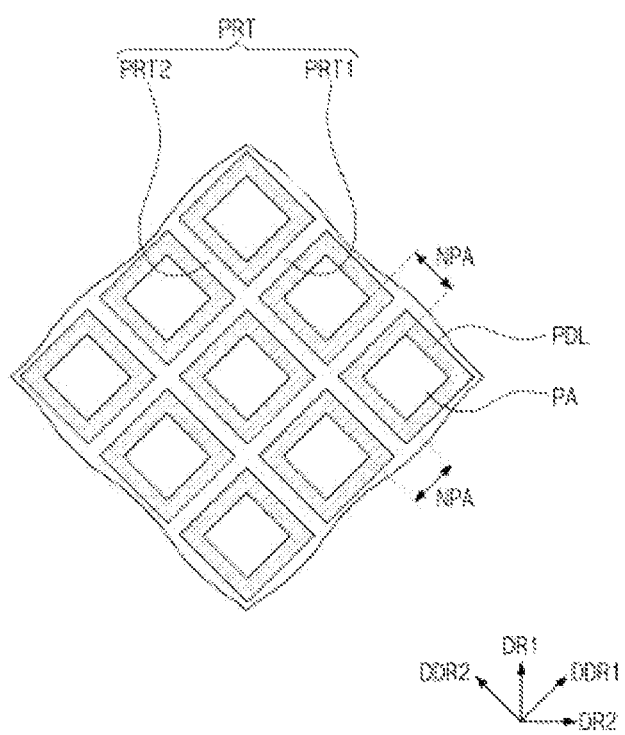
FIG. 13 is an enlarged plan view illustrating an embodiment of a planar structure of a protruding portion shown in FIG. 12.

FIG. 13 is an enlarged plan view illustrating an embodiment of a planar structure of a protruding portion PRT shown in FIG. 12.

FIG. 13 illustrates a planar structure of a region of the display panel DP, in which nine pixel regions PA are disposed, and for convenience in illustration and description, the pixel regions PA are illustrated to have the same size.

Referring to FIG. 13, the protruding portion PRT may include a first protruding portion PRT1 provided in plural (e.g., a plurality of first protruding portions PRT1) and a second protruding portion PRT2 provided in plural (e.g., a plurality of second protruding portions PRT2), which are lengthwise extended to cross each other when viewed in a plan view. The first protruding portions PRT1 may be lengthwise extended along the first diagonal direction DDR1 and may be arranged along the second diagonal direction DDR2. The second protruding portions PRT2 may be lengthwise extended along the second diagonal direction DDR2 and may be arranged along the first diagonal direction DDR1. The first and second protruding portions PRT1 and PRT2 may be connected to each other to form a single object. The pixel definition layer PDL may be provided as a discrete pattern around the protruding portion PRT.

Figure 14:
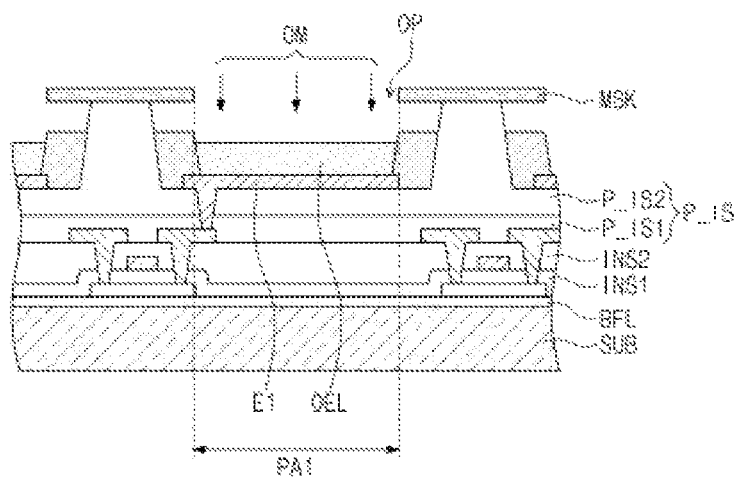
FIG. 14 is an enlarged cross-sectional view illustrating an embodiment of a mask relative to the protruding portion of FIG. 12.

FIG. 14 is an enlarged cross-sectional view illustrating an embodiment of a mask MSK disposed relative to the protruding portion of FIG. 12.

FIG. 14 illustrates a portion of the pixel definition layer PDL and a portion of the protruding portion PRT, which are adjacent to the first pixel region PA1, within a preliminary structure of a display panel DP. An embodiment of a method of manufacturing a display device DD may include providing a display panel DP including the pixel definition layer PDL, the protruding portion PRT, the first pixel region PA1, and respectively elements of the foregoing features.

Referring to FIG. 14, a mask MSK, in which an opening OP is defined, may be disposed on the preliminary structure of the display panel DP to correspond to the protruding portion PRT thereof. The opening OP may be overlapped with and correspond to the first pixel region PA1. The mask MSK may be in contact with a top surface of the protruding portion PRT. An organic material OM for forming the organic emission layer OEL may be provided onto the first electrode E1, which is exposed to outside the pixel definition layer PDL by the pixel opening PX_OP thereof, through the opening OP.

Even though the mask MSK may be in contact with the protruding portion PRT, the mask MSK may be spaced apart from the pixel definition layer PDL in an upward direction (e.g., along a thickness direction of the display panel DP). That is, the mask MSK may not be in direct contact with the pixel definition layer PDL, and thus, damage to the pixel definition layer PDL may be reduced or effectively prevented.

Referring again to FIG. 14, a sidewall of the pixel definition layer PDL defines the pixel opening PX_OP. Damage to the portion of the pixel definition layer PDL which defines the sidewall at the pixel opening PX_OP may be reduced or effectively prevented by disposing a top surface of a protrusion (e.g., protruding portion PRT in FIG. 14) which is furthest from the substrate SUB, to be further from the substrate SUB than a top surface of the portion of the pixel definition layer PDL which is closest to the pixel opening PX_OP and defines the sidewall at the pixel opening PX_OP.

Figure 15:
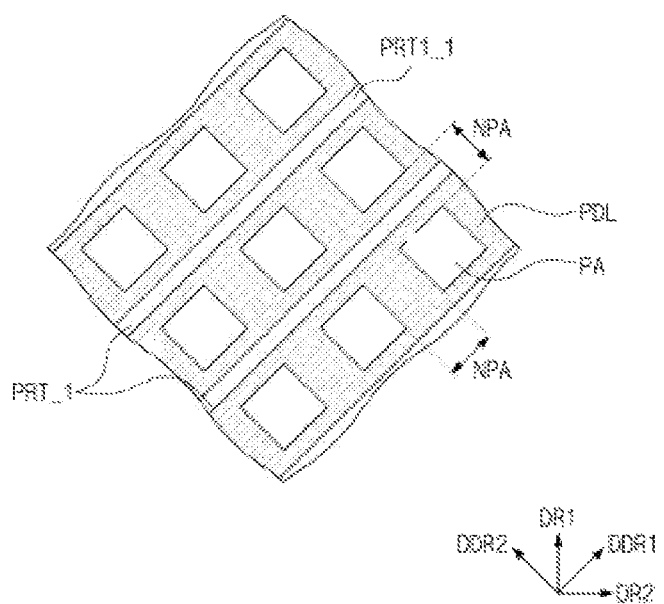
FIGS. 15 and 16 are enlarged plan views illustrating embodiments of modified planar structures of a protruding portion.
Figure 16:
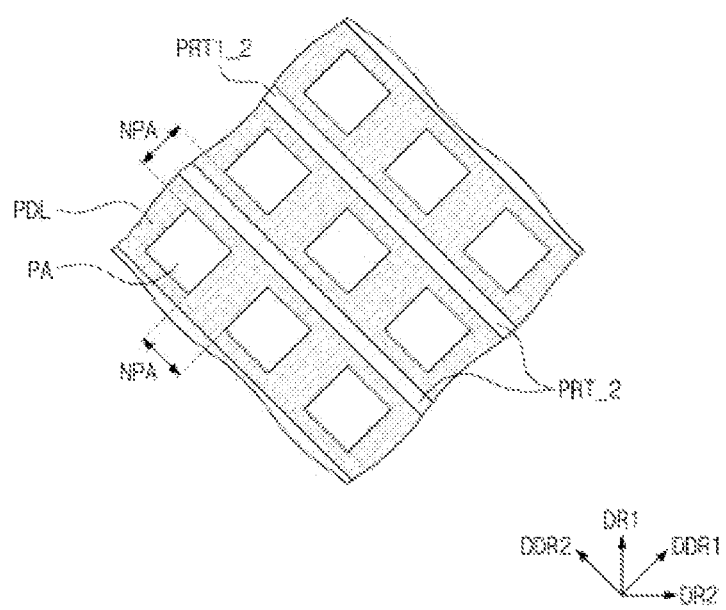

FIGS. 15 and 16 are enlarged plan views illustrating embodiments of a modified planar structure of the protruding portion PRT.

Each of FIGS. 15 and 16 illustrates a plan view of a portion corresponding to a portion shown in FIG. 13.

In FIG. 13, the protruding portion PRT is illustrated to include lengthwise portions extended in each of the first and second diagonal directions DDR1 and DDR2, but the invention. In an embodiment, for example, the protruding portion PRT may be defined by portions lengthwise extended in only one of the first and second diagonal directions DDR1 and DDR2.

In an embodiment, for example, as shown in FIG. 15, a protruding portion PRT_1 may include a plurality of first protruding portions PRT1_1 which are each lengthwise extended along the first diagonal direction DDR1 and are arranged along the second diagonal direction DDR2.

Alternatively, as shown in FIG. 16, a protruding portion PRT_2 may include a plurality of first protruding portions PRT1_2, which are each lengthwise extended along the second diagonal direction DDR2 and are arranged along the first diagonal direction DDR1.

FIGS. 17 to 21 are enlarged cross-sectional views illustrating an embodiment of a method of fabricating a display device.

For convenience in description, each of FIGS. 17 to 21 illustrates a section of a portion corresponding to that shown for the display device DD in FIG. 12.

Figure 17:
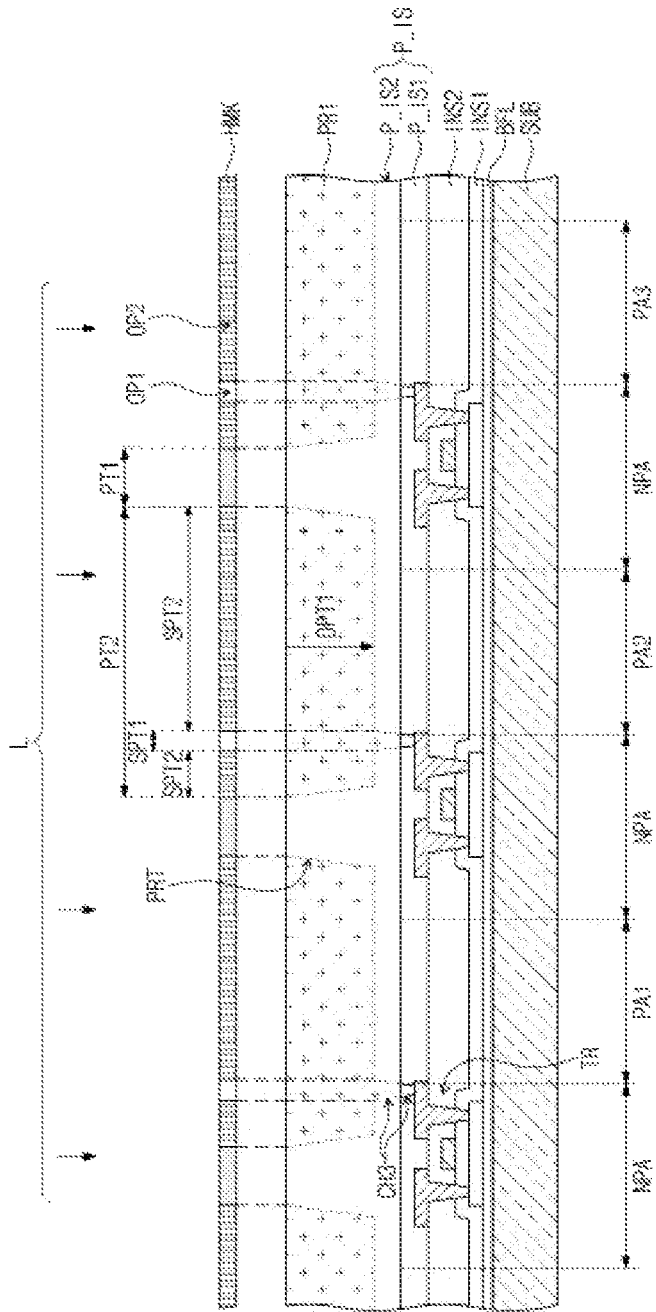
FIGS. 17 to 21 are enlarged cross-sectional views illustrating an embodiment of a method of providing a display device.

Referring to FIG. 17, the substrate SUB, on which the transistors TR and the first planarization insulating layer P_IS1 are disposed, may be provided. The substrate SUB may include the first, second, and third pixel regions PA1, PA2, and PA3, and the non-pixel region NPA which is provided adjacent to each of the first, second, and third pixel regions PA1, PA2, and PA3. A lower portion of the third contact holes CH3 may be defined in the first planarization insulating layer P_IS1.

A first photoresist layer PR1 may be provided on the first planarization insulating layer P_IS1. The first photoresist layer PR1 may be used to form the second planarization insulating layer P_IS2 and the protruding portion PRT. For convenience in illustration, a portion corresponding to a shape of the second planarization insulating layer P_IS2 and the protruding portion PRT in the display device DD of FIG. 12 is depicted by a dotted line.

The first photoresist layer PR1 may include a first portion PT1, which is overlapped with and corresponding to the non-pixel region NPA, and a second portion PT2 provided in plural (e.g., second portions PT2) which are overlapped with and corresponding to the first, second, and third pixel regions PA1, PA2, and PA3. The first portion PT1 may be a region of the first photoresist layer PR1 which will form the protruding portion PRT, and may have a width along the substrate SUB which is smaller than a width of the non-pixel region NPA.

The second portions PT2 may be defined as remaining portions of the first photoresist layer PR1, except the first portion PT1. The third contact holes CH3 may be formed corresponding to the second portions PT2. Hereinafter, one of the second portion PT2 and elements associated with the one of the second portion PT2 will be described, for convenience in description.

A halftone mask HMK may be disposed on the first photoresist layer PR1. A first opening OP1 may be defined in a portion of the halftone mask HMK which is overlapped with and corresponds to a position of the third contact hole CH3 within the second portion PT2.

A second opening OP2 provided in plural (e.g., second openings OP2) may be defined at positions of the halftone mask HMK which are overlapped with and correspond to the second portion PT2, except the first opening OP1. Each of the second openings OP2 may have a size or dimension that is smaller than a size or dimension the first opening OP1, where the size or dimension is defined along the substrate SUB. A portion of the halftone mask HMK overlapped with the first portion PT1 may be solid (e.g., none of the first opening OP1 or the second opening OP2) so as to block light.

Hereinafter, a portion of the second portion PT2 which is overlapped with the first opening OP1 in a plan view may be defined as a first sub-portion SPT1, and a portion of the second portion PT2 which is not overlapped with the first opening OP1 in a plan view may be defined as a second sub-portion SPT2.

An exposure process may be performed using the halftone mask HMK. Since the halftone mask HMK blocks an exposure light L from being incident onto the first portion PT1, the first portion PT1 of the first photoresist layer PR1 may not be exposed and may remain on the substrate SUB. The first sub-portion SPT1 of the first photoresist layer PR1 may be exposed by the exposure light L passed through the first opening OP1. The second sub-portion SPT2 of the first photoresist layer PR1 may be exposed by the exposure light L passed through the second openings OP2.

Since a size of each of the second openings OP2 is smaller than a size of the first opening OP1, the second sub-portion SPT2 of the first photoresist layer PR1 may be less exposed, as compared with the first sub-portion SPT1 of the first photoresist layer PR1. In an embodiment, for example, the entirety of a thickness of the first sub-portion SPT1 of the first photoresist layer PR1 may be exposed along a thickness direction of the first photoresist layer PR1 (e.g., along the third direction DR3). An entirety of a thickness of the second sub-portion SPT2 of the first photoresist layer PR1 may not be exposed along in the thickness direction of the first photoresist layer PR1 (e.g., along the third direction DR3) and may be exposed to only a specific depth along the thickness of the first photoresist layer PR1.

The exposed portion of the first photoresist layer PR1 may be exemplarily depicted by the dotted line of FIG. 17. In an embodiment, for example, a region depicted with the symbol "+" may be the exposed portion of the first photoresist layer PR1. The second sub-portion SPT2 of the second portion PT2 of the first photoresist layer PR1 may be exposed to a first depth DPT1. That is, removing the first depth DPT1 (e.g., a first thickness) of the second portion PT2 define a recess adjacent to the first portion PT1. The first depth DPT1 may be between vertically opposite two surfaces (e.g., top and bottom surfaces) of the second portion PT2 of the first photoresist layer PR1. By contrast, the first sub-portion SPT1 of the second portion PT2 of the first photoresist layer PR1 may be exposed from the top surface to the bottom surface of the second portion PT2 of the first photoresist layer PR1.

The exposed portion of the first photoresist layer PR1 may be removed by a developing process. In an embodiment, for example, a portion of the second portion PT2 of the first photoresist layer PR1 from the top surface thereof to the first depth DPT1 may be removed. In addition, the first sub-portion SPT1 of the second portion PT2 of the first photoresist layer PR1 corresponding with the third contact hole CH3 may be entirely removed to form an upper portion of the third contact hole CH3 connected to the lower portion thereof in the first planarization insulating layer P_IS1.

Figure 18:
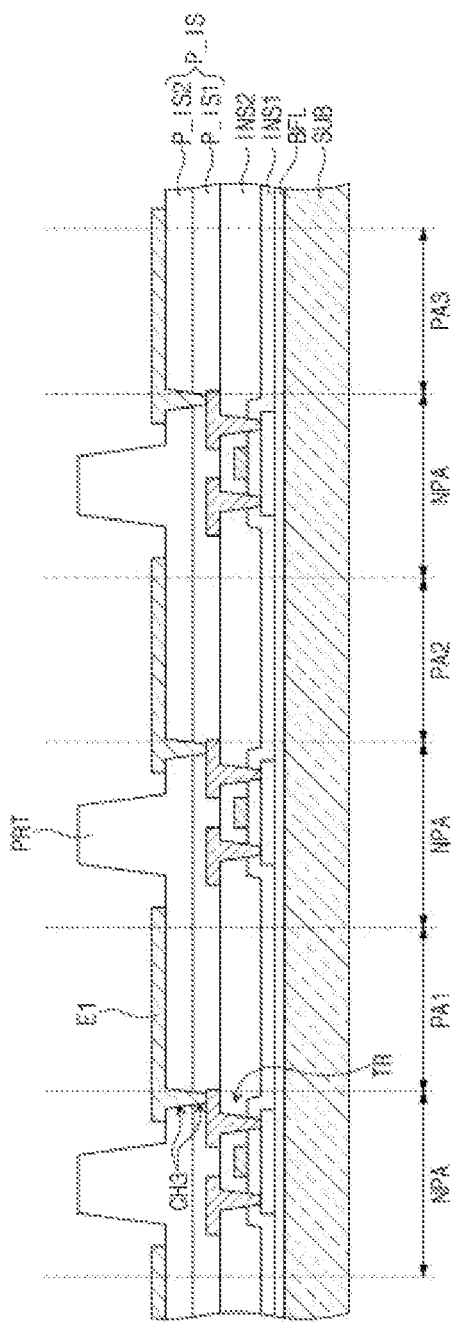

In removing the exposed portion of the first photoresist layer PR1 by the developing process, the second planarization insulating layer P_IS2 and the protruding portion PRT defined thereby may be provided or formed, as shown in FIG. 18. The protruding portion PRT in the non-pixel region NPA extends further from the substrate SUB than a remainder of the planarization insulating layer P_IS in the non-pixel region NPA. The upper portion of the third contact holes CH3 may be defined in the second planarization insulating layer P_IS2. The first electrode E1 provided in plural (e.g., first electrodes E1) may be respectively connected to the transistors TR through the third contact holes CH3 which are defined extended through the first and second planarization insulating layers P_IS1 and P_IS2.

Figure 19:
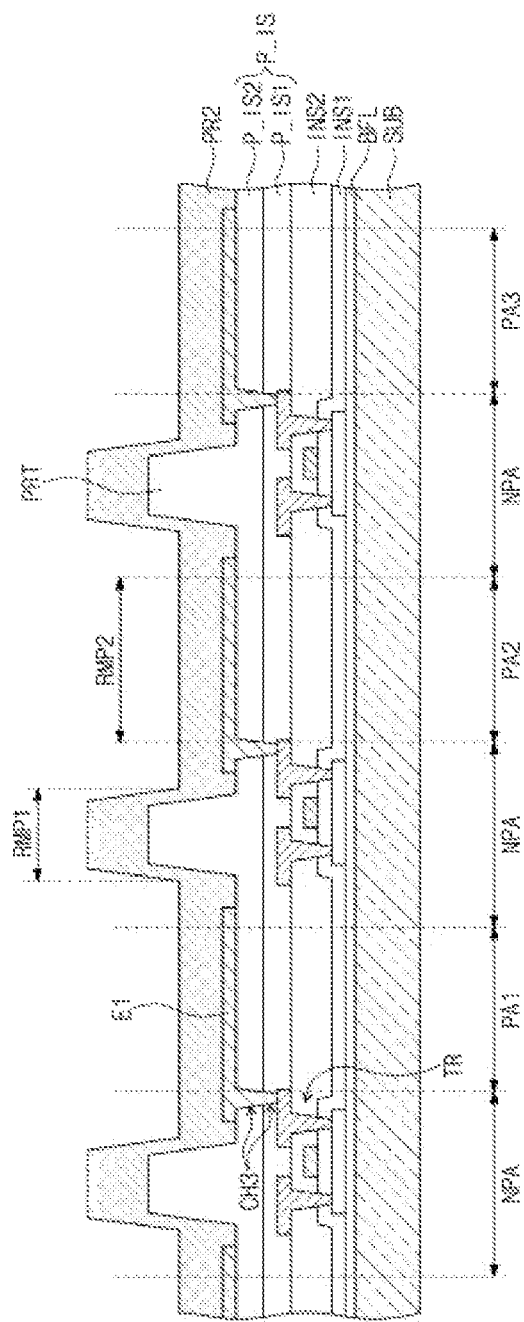

Referring to FIG. 19, a second photoresist layer PR2 may be provided on the second planarization insulating layer P_IS2. The second photoresist layer PR2 may be defined as a pixel definition layer ("PDL")-forming layer or pixel definition material layer.

A portion of the second photoresist layer PR2 which is disposed on and corresponding to the protruding portion PRT, may be defined as a first removal portion RMP1, and portions of the second photoresist layer PR2 which are overlapped with and corresponding to the first, second, and third pixel regions PA1, PA2, and PA3 may be define a second removal portion RMP2 in plural (e.g., second removal portions RMP2). The first and second removal portions RMP1 and RMP2 of the second photoresist layer PR2 may be removed while portions of the second photoresist layer PR2 remain on the substrate SUB to form the pixel definition layer PDL. In a direction along the substrate SUB, the second removal portion RMP2 is spaced apart from the first removal portion RMP1 such that a remaining portion of the second photoresist layer PR2 is disposed between the protruding portion and the pixel opening PX_OP and defines the pixel opening PX_OP.

Figure 20:
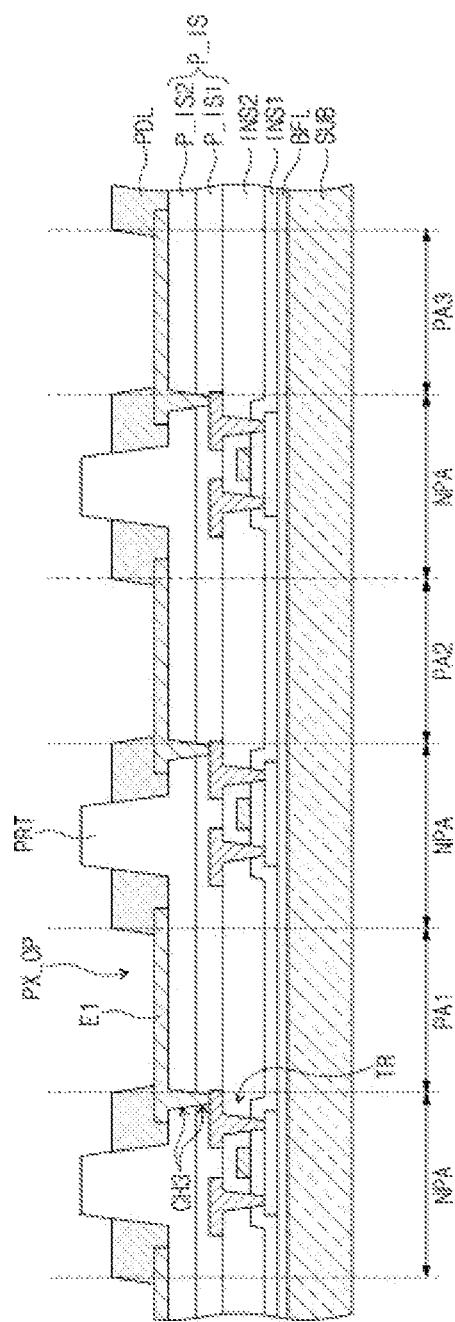

Referring to FIG. 20, the pixel definition layer PDL may be provided or formed with the removal of the first and second removal portions RMP1 and RMP2. As a result of the removal of the first removal portion RMP1, the protruding portion PRT may penetrate a thickness of the pixel definition layer PDL and may be extended to a level higher than the pixel definition layer PDL, with respect to a common element such as a top surface of the substrate SUB. As a result of the removal of the second removal portions RMP2, the pixel openings PX_OP may be defined in the pixel definition layer PDL. At the pixel opening PX_OP, the first electrodes E1 are exposed to outside the pixel definition layer PDL.

In a conventional display device DD where the protruding portion PRT penetrating the thickness of the pixel definition layer PDL is not provided or formed by an extended portion of the second planarization insulating layer P_IS2, an additional spacer structure may be disposed on a top surface of the pixel definition layer PDL. Referring to FIG. 14, the mask MSK may be disposed on the spacer structure which is provided on the top surface of the pixel definition layer PDL. In this case, an additional mask may be needed to form the spacer structure, and the use of the additional mask member may lead to an increase in fabrication cost, since the additional mask member may be relatively expensive.

By contrast, according to one or more embodiment of the invention, the protruding portion PRT may be provided or formed by using the halftone mask HMK in a same process in which the second planarization insulating layer P_IS2 is provided. That is, there is no need for the additional use of the expensive mask, and thus, reducing an overall fabrication cost of a display device DD is possible.

Figure 21:
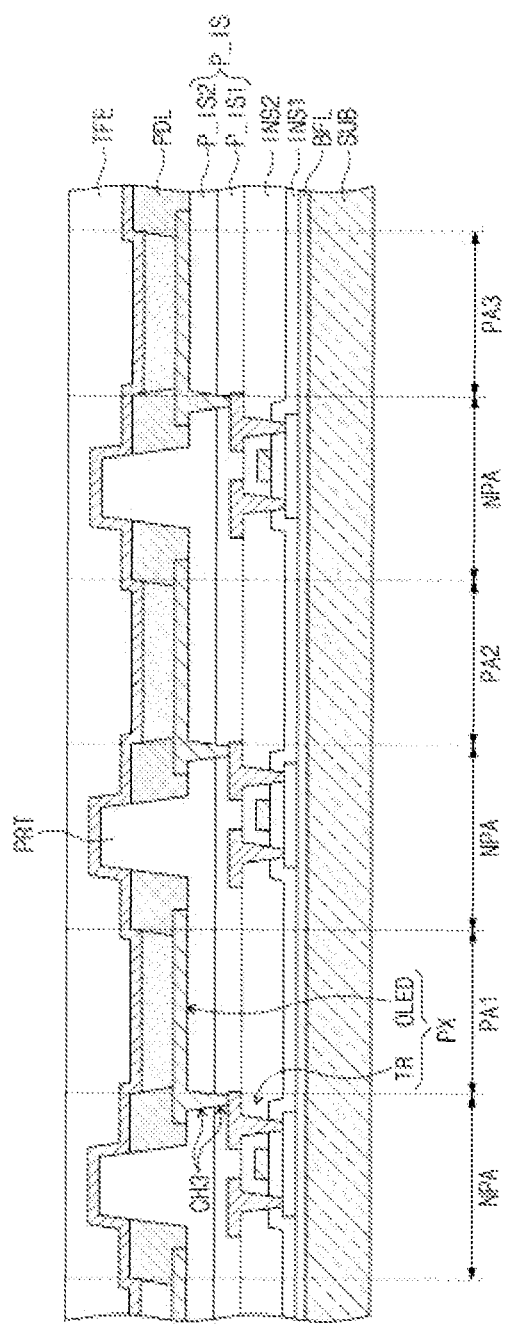

Referring to FIG. 21, the emission elements OLED may be provided in the pixel openings PX_OP, and the thin encapsulation layer TFE may be provided on the emission elements OLED. Although not shown in FIG. 21, the input-sensing portion TSP, the color filter layer CFL, and the window WIN may be provided on the thin encapsulation layer TFE (refer to FIG. 4).

Figure 22:
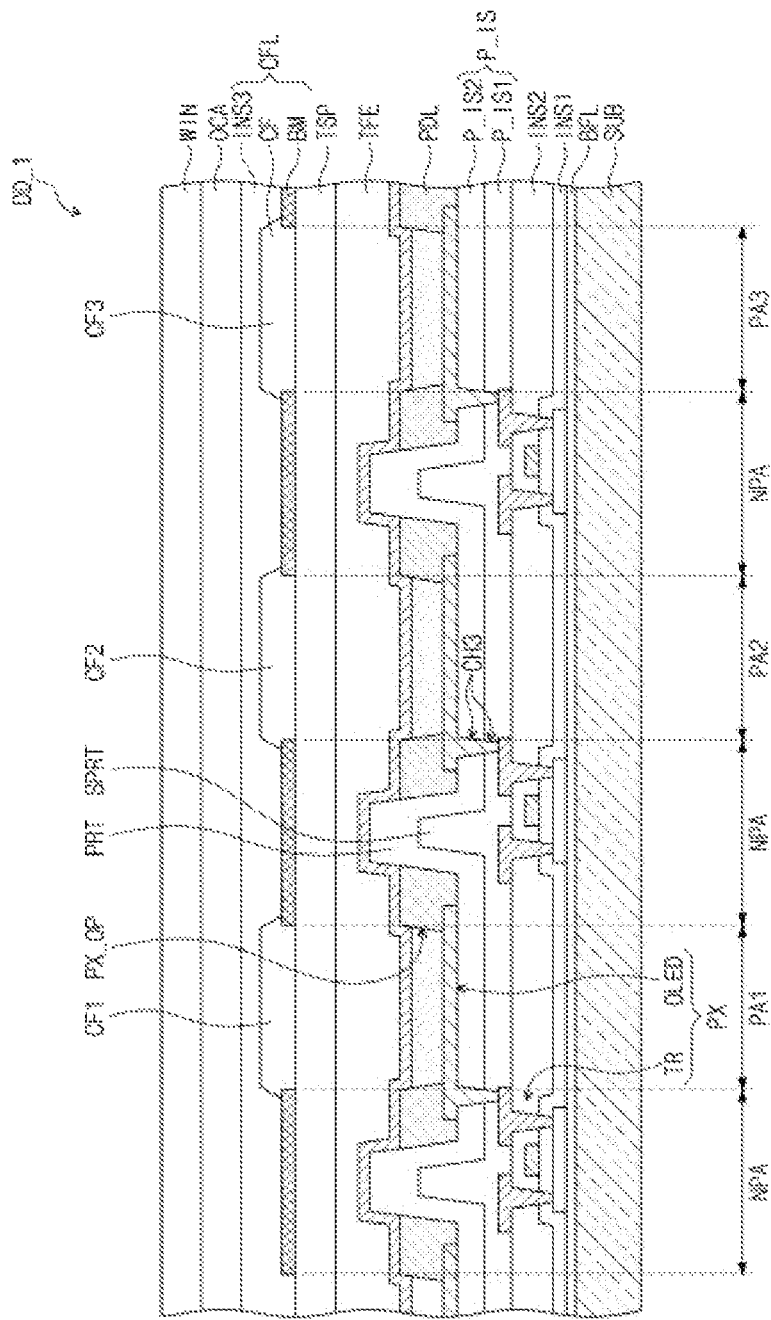
FIGS. 22 to 24 are enlarged cross-sectional views illustrating modified embodiments of a display device.
Figure 23:
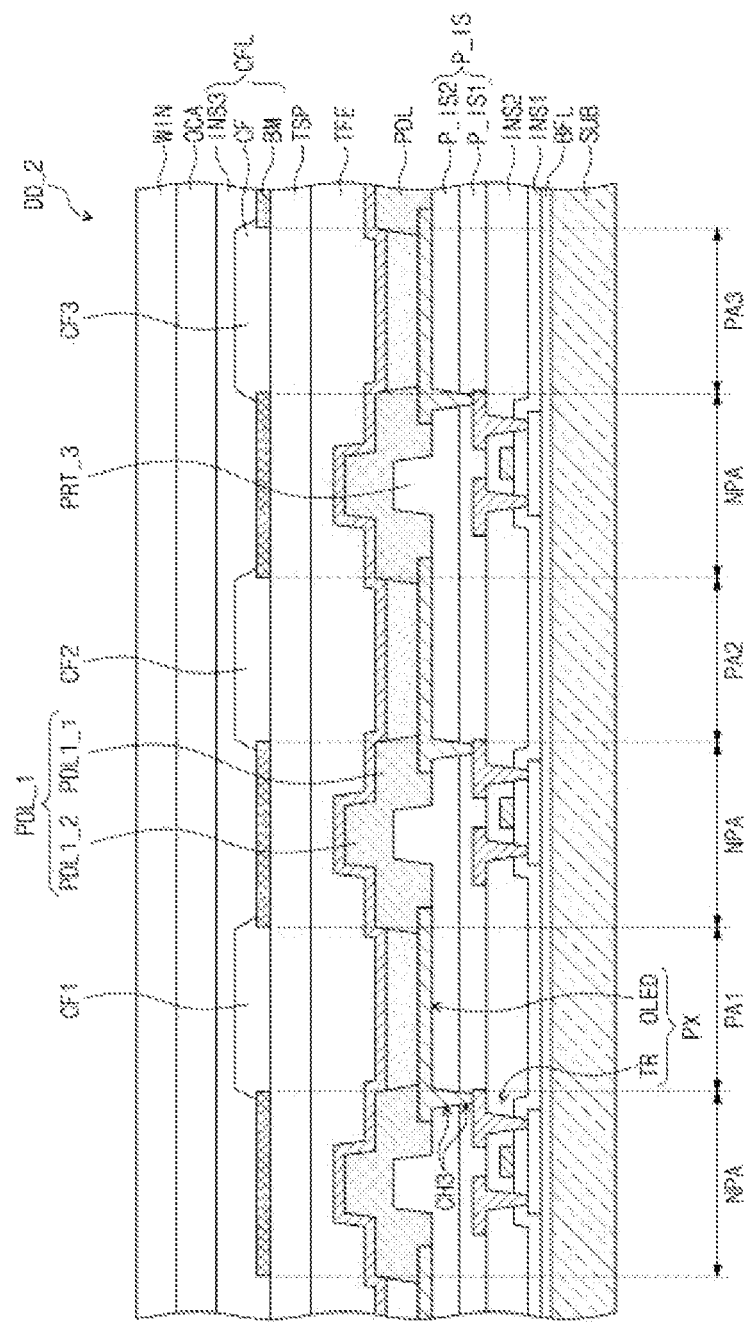
Figure 24:
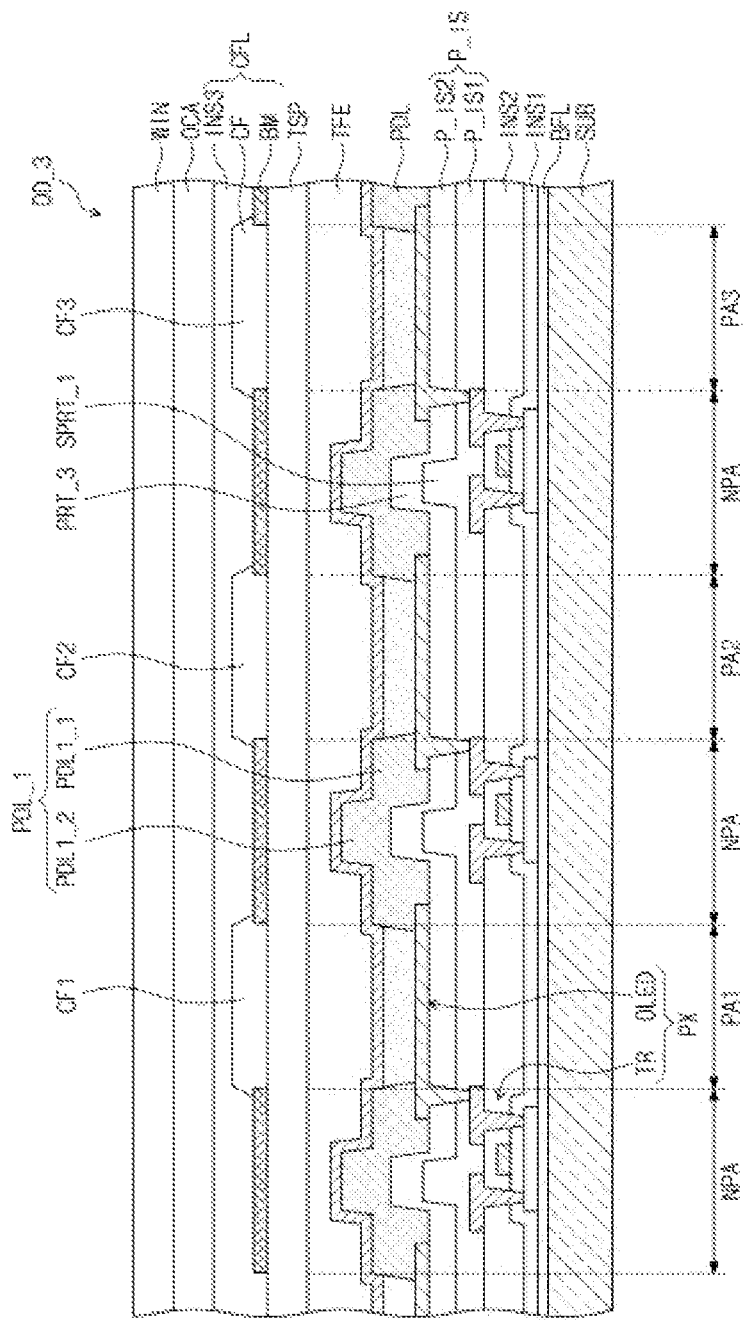

FIGS. 22 to 24 are enlarged cross-sectional views illustrating modified embodiments of the display device DD.

Each of FIGS. 22 to 24 illustrates an enlarged cross-section of a portion of a display device DD corresponding to FIG. 12. The following description will be focused on technical features of display devices DD_1, DD_2 and DD_3 of FIGS. 22 to 24 that are different from those of the display device DD described with reference to FIG. 12, and an element described above will be identified by the same reference number without repeating an overlapping description thereof.

Referring to FIG. 22, the display device DD_1 may include a sub-protruding portion SPRT which is overlapped with and corresponds to the non-pixel region NPA and is a protrusion of the first planarization insulating layer P_IS1. The protruding portion PRT as a protrusion of the second planarization insulating layer P_IS2 may be disposed on the sub-protruding portion SPRT. That is, in the non-pixel region NPA, the sub-protruding portion SPRT which is defined by the first planarization insulating layer P_IS1 is aligned with the protruding portion PRT which is defined by the second planarization insulating layer P_IS2. The protruding portion PRT may be substantially the same as the protruding portion PRT shown in FIG. 12. In a direction along the substrate SUB, the sub-protruding portion SPRT may have a width smaller than a width of both the non-pixel region NPA and the pixel definition layer PDL therein. The protruding portion PRT and the sub-protruding portion SPRT together may form a protrusion of the planarization insulating layer P_IS.

Referring to FIG. 23, the display device DD_2 may include a protruding portion PRT_3 which is overlapped with and corresponds to the non-pixel region NPA and is a protrusion of the second planarization insulating layer P_IS2. In an direction along the substrate SUB, the protruding portion PRT_3 may have a width smaller than a width of both the non-pixel region NPA and a pixel definition layer PDL_1 (e.g., pixel definition pattern PDL_1) therein.

In the non-pixel region NPA, the pixel definition layer PDL_1 may be disposed on the second planarization insulating layer P_IS2 and the protruding portion PRT_3 thereof. When viewed in a plan view, the pixel definition layer PDL_1 may include a first pixel definition layer PDL1_1 which is disposed corresponding to a periphery of the protruding portion PRT_3, and a second pixel definition layer PDL1_2 which is disposed corresponding to the protruding portion PRT_3. That is, in the non-pixel region NPA, the protruding portion PRT_3 which is defined by the second planarization insulating layer P_IS2 is aligned with the second pixel definition layer PDL1_2 which is defined by the pixel definition layer PDL. The first pixel definition layer PDL1_1 may have a top surface furthest from the substrate SUB which is at a level higher than a top surface of the first pixel definition layer PDL1_1. The protruding portion PRT_3 and the pixel definition layer PDL_1 together may form a protrusion.

Referring again to FIG. 23, a sidewall of the first pixel definition layer PDL1_1 defines the pixel opening PX_OP. Damage to the portion of the pixel definition layer PDL_1 which defines the sidewall at the pixel opening PX_OP may be reduced or effectively prevented by disposing a top surface of a protrusion (e.g., second pixel definition layer PDL1_2) which is furthest from the substrate SUB, to be further from the substrate SUB than a top surface of the first pixel definition layer PDL1_1 which is closest to the pixel opening PX_OP and defines the sidewall at the pixel opening PX_OP. That is, even where the pixel definition layer PDL_1 forms the top surface of the protrusion, the mask MSK (refer to FIG. 14) may still be suspended on the protrusion to obviate direct or physical contact of the mask MSK with the portion of the pixel definition layer PDL_1 defining sidewalls thereof at the pixel opening PX_OP and thereby reduce or effectively prevent the pixel definition layer PDL_1 at the sidewalls from being damaged.

Referring to FIG. 24, the display device DD_3 may include a sub-protruding portion SPRT_1 which is overlapped with and corresponding to the non-pixel region NPA and is a protrusion of the first planarization insulating layer P_IS1. The protruding portion PRT_3 and the pixel definition layer PDL_1 may be substantially the same as the protruding portion PRT_3 and the pixel definition layer PDL_1 shown in FIG. 23. That is, in the non-pixel region NPA, the protruding portion PRT_3 is aligned with both the second pixel definition layer PDL1_2 and the sub-protruding portion SPRT_1.

The protruding portion PRT_3 as a protrusion of the second planarization insulating layer P_IS2 may be disposed on the sub-protruding portion SPRT_1. In a direction along the substrate SUB, the sub-protruding portion SPRT_1 may have a width smaller than a width of both the non-pixel region NPA and the pixel definition layer PDL_1 therein.

According to one or more embodiment of the invention, a mask MSK may be suspended on a protrusion of a material layer (e.g., a planarization insulating layer P_IS) which penetrates a pixel definition layer PDL, and disposes a top surface of the protrusion at a level higher than the pixel definition layer PDL. Accordingly, direct or physical contact of a mask MSK used to form an organic emission layer OEL, with the pixel definition layer PDL is obviated to thereby reduce or effectively prevent the pixel definition layer PDL from being damaged.

According to one or more embodiment of the invention, even where the pixel definition layer PDL forms the top surface of the protrusion, the mask MSK may still be suspended on the protrusion to obviate direct or physical contact of the mask MSK with the portion of the pixel definition layer PDL defining sidewalls thereof at the pixel opening PX_OP and thereby reduce or effectively prevent the pixel definition layer PDL at the sidewalls from being damaged.

In addition, a same one of the mask MSK for forming the planarization insulating layer P_IS is used to provide or form the protrusion adjacent to the pixel definition layer PDL. That is, there is no need for an additional expensive mask, and thus, reducing a fabrication cost is possible.

While embodiments of the invention have been particularly shown and described, it will be understood by one of ordinary skill in the art that variations in form and detail may be made therein without departing from the spirit and scope of the attached claims.

What is claimed is:

1. A display device, comprising:
   a substrate;
   a transistor disposed on the substrate;
   a planarization insulating layer disposed on the transistor and the substrate;
   a pixel definition layer disposed on the planarization insulating layer, the pixel definition layer defining a pixel opening;
   an emission element in the pixel opening and connected to the transistor; and
   a protruding portion protruding upward from the planarization insulating layer, the protruding portion extending through the pixel definition layer to extend further from the substrate than the pixel definition layer,
   wherein the protruding portion is not separated from the planarization insulating layer and is formed integrally with the planarization insulating layer.

2. The display device of claim 1, wherein the planarization insulating layer is provided in plural comprising:
   a first planarization insulating layer which covers the transistor; and
   a second planarization insulating layer disposed on the first planarization insulating layer,
   wherein the second planarization insulating layer defines the protruding portion.

3. The display device of claim 2, wherein the emission element is connected to the transistor at a contact hole defined through both the first planarization insulating layer and the second planarization insulating layer.

4. The display device of claim 2, wherein the first planarization insulating layer and the second planarization insulating layer comprise an organic material.

5. The display device of claim 2, wherein the second planarization insulating layer comprises photo-sensitive polyimide.

6. The display device of claim 2, wherein the first planarization insulating layer defines a sub-protruding portion corresponding to the protruding portion defined by the second planarization insulating layer.

7. The display device of claim 6, wherein the protruding portion is disposed on the sub-protruding portion.

8. The display device of claim 1, further comprising:
a thin encapsulation layer disposed on the emission element, the pixel definition layer, and the protruding portion; and
an input-sensing layer disposed on the thin encapsulation layer.

9. The display device of claim 8, further comprising:
a color filter disposed on the input-sensing layer; and
a black matrix disposed on the input-sensing layer.

10. The display device of claim 9, further comprising:
a pixel region; and
a non-pixel region adjacent to the pixel region,
wherein
the pixel region and the non-pixel region are divided on a plane,
the emission element and the color filter overlap the pixel region, and
the black matrix and the protruding portion overlap the non-pixel region.

11. The display device of claim 1, wherein the protruding portion is provided in plural comprising:
a plurality of first protruding portions extended along a first diagonal direction and arranged along a second diagonal direction which crosses the first diagonal direction; and
a plurality of second protruding portions extended along the second diagonal direction and arranged along the first diagonal direction.

12. The display device of claim 1, wherein the protruding portion is provided in plural comprising a plurality of first protruding portions extended along a first diagonal direction and arranged along a second diagonal direction which crosses the first diagonal direction.

13. The display device of claim 1, wherein the pixel definition layer has a black color.

14. The display device of claim 1, wherein a width of the protruding portion is smaller than a width of the pixel definition layer.

15. A display device, comprising:
a substrate;
a transistor disposed on the substrate;
a planarization insulating layer disposed on the transistor and the substrate;
a protruding portion protruding upward from the planarization insulating layer;
a pixel definition layer disposed on the planarization insulating layer and the protruding portion, the pixel definition layer defining a pixel opening spaced from the protruding portion; and
an emission element in the pixel opening and connected to the transistor,
wherein
the protruding portion is not separated from the planarization insulating layer and is formed integrally with the planarization insulating layer, and
a width of the protruding portion is smaller than a width of pixel definition layer.

16. The display device of claim 15, wherein the pixel definition layer comprises:
a first pixel definition layer disposed around the protruding portion, when viewed in a plan view; and
a second pixel definition layer disposed at a level higher than the first pixel definition layer and disposed on the protruding portion.

17. The display device of claim 15, wherein the planarization insulating layer is provided in plural comprising:
a first planarization insulating layer which covers the transistor; and
a second planarization insulating layer disposed on the first planarization insulating layer,
wherein the second planarization insulating layer defines the protruding portion.

18. The display device of claim 17, wherein
the first planarization insulating layer defines a sub-protruding portion corresponding to the protruding portion defined by the second planarization insulating layer, and
the protruding portion is disposed on the sub-protruding portion.

* * * * *